(12) United States Patent
Campanella Pineda et al.

(10) Patent No.: US 11,185,886 B2
(45) Date of Patent: Nov. 30, 2021

(54) MICROELECTROMECHANICAL SYSTEMS, DEVICES, AND METHODS FOR FABRICATING A MICROELECTROMECHANICAL SYSTEMS DEVICE, AND METHODS FOR GENERATING A PLURALITY OF FREQUENCIES

(71) Applicant: VANGUARD INTERNATIONAL SEMICONDUCTOR SINGAPORE PTE. LTD., Singapore (SG)

(72) Inventors: Humberto Campanella Pineda, Singapore (SG); Joan Josep Giner De Haro, Singapore (SG); You Pak-Chum Qian, Singapore (SG); Rakesh Kumar, Singapore (SG)

(73) Assignee: VANGUARD INIERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 468 days.

(21) Appl. No.: 16/205,337

(22) Filed: Nov. 30, 2018

(65) Prior Publication Data
US 2020/0171541 A1 Jun. 4, 2020

(51) Int. Cl.
| | | |
|---|---|---|
| B06B 1/06 | (2006.01) |
| H01L 41/04 | (2006.01) |
| H01L 41/22 | (2013.01) |
| B06B 1/02 | (2006.01) |
| H01L 41/083 | (2006.01) |
| H01L 41/277 | (2013.01) |

(Continued)

(52) U.S. Cl.
CPC .......... *B06B 1/0614* (2013.01); *B06B 1/0276* (2013.01); *H01L 41/042* (2013.01); *H01L 41/0471* (2013.01); *H01L 41/083* (2013.01); *H01L 41/277* (2013.01); *G06K 9/0002* (2013.01)

(58) Field of Classification Search
CPC .. H01L 41/047; H01L 41/0471; H01L 41/083
USPC ..... 310/313 R, 313 A, 313 B, 313 C, 313 D, 310/322, 334, 365, 366
See application file for complete search history.

(56) References Cited

U.S. PATENT DOCUMENTS

| | | |
|---|---|---|
| 3,435,250 A | 3/1969 | Reggia |
| 5,889,870 A | 3/1999 | Norris |

(Continued)

*Primary Examiner* — Derek J Rosenau
(74) *Attorney, Agent, or Firm* — Winston Hsu

(57) ABSTRACT

A MEMS device may include a first electrode region; a first piezoelectric layer arranged over the first electrode region; a second electrode region arranged over the first piezoelectric layer; a second piezoelectric layer arranged over the first piezoelectric layer and the second electrode region; a third electrode region arranged over the second piezoelectric layer; a first input port coupled to the first electrode region and/or the second electrode region for providing a first electrical signal to the first piezoelectric layer to generate a first vibration in the first piezoelectric layer; a second input port coupled to the second electrode region and/or the third electrode region for providing a second electrical signal to the second piezoelectric layer to generate a second vibration in the second piezoelectric layer; and an output port configured to receive an output signal including a superposition of the first vibration and the second vibration.

17 Claims, 20 Drawing Sheets

(51) Int. Cl.
*H01L 41/047* (2006.01)
*G06K 9/00* (2006.01)

(56) References Cited

U.S. PATENT DOCUMENTS

| | | | |
|---|---|---|---|
| 6,399,406 | B2 | 6/2002 | Chan et al. |
| 6,640,631 | B1* | 11/2003 | Toda ..................... G01N 29/07 |
| | | | 310/334 |
| 8,493,157 | B2 | 7/2013 | Steeneken et al. |
| 9,647,195 | B2 | 5/2017 | Hajati |
| 2007/0267942 | A1* | 11/2007 | Matsumoto ............ H03H 9/175 |
| | | | 310/313 A |
| 2013/0134838 | A1* | 5/2013 | Yun ....................... H01L 41/047 |
| | | | 310/366 |
| 2014/0043183 | A1 | 2/2014 | Stolarczyk et al. |
| 2016/0087187 | A1* | 3/2016 | Burak .................... H01L 41/047 |
| | | | 310/349 |
| 2019/0177160 | A1 | 6/2019 | Qian et al. |

* cited by examiner

| | |
|---|---|
| Frequency at Input port 1 (f1) | 30.0 MHz |
| Frequency at Input port 2 (f2) | 30.2 MHz |

| Possible mix products at Output Port 3 (P3): | Frequency | Application: |
|---|---|---|
| f2 - f1 | 200 kHz | Gesture recognition |
| f1 only (single excitation) | 30.0 MHz | Fingerprint |
| f2 + f1 | 60.2 MHz | High-end fingerprint |

```
┌─────────────────────────────────────────────────┐
│ 2102 — Provide a MEMS device including: a first │
│ electrode layer; a first piezoelectric layer    │
│ arranged over the first electrode layer; a      │
│ second electrode layer arranged over the first  │
│ piezoelectric layer; a second piezoelectric     │
│ layer arranged over the first piezoelectric     │
│ layer and the second electrode layer; and a     │
│ third electrode layer arranged over the second  │
│ piezoelectric layer                             │
└─────────────────────────────────────────────────┘
                         │
┌─────────────────────────────────────────────────┐
│ 2104 — Provide a first electrical signal to the │
│ first piezoelectric layer to generate a first   │
│ vibration in the first piezoelectric layer,     │
│ through a first input port coupled to at least  │
│ one of the first electrode layer and the second │
│ electrode layer                                 │
└─────────────────────────────────────────────────┘
                         │
┌─────────────────────────────────────────────────┐
│ 2106 — Provide a second electrical signal to    │
│ the second piezoelectric layer to generate a    │
│ second vibration in the second piezoelectric    │
│ layer, through a second input port coupled to   │
│ at least one of the second electrode layer and  │
│ the third electrode layer.                      │
└─────────────────────────────────────────────────┘
                         │
┌─────────────────────────────────────────────────┐
│ 2108 — Receive an output signal including a     │
│ superposition of the first vibration and the    │
│ second vibration, using an output port.         │
└─────────────────────────────────────────────────┘
```

FIG. 21

MICROELECTROMECHANICAL SYSTEMS, DEVICES, AND METHODS FOR FABRICATING A MICROELECTROMECHANICAL SYSTEMS DEVICE, AND METHODS FOR GENERATING A PLURALITY OF FREQUENCIES

TECHNICAL FIELD

Various embodiments relate to microelectromechanical systems (MEMS) devices, methods for fabricating a MEMS device, and methods for generating a plurality of frequencies.

BACKGROUND

Ultrasonic MEMS transducers are in demand for a multitude of sensing applications, such as fingerprint sensing and gesture recognition. Generally, each application may require generation of ultrasound in a specific frequency. State of the art ultrasonic transducers generally operate only in a single frequency because the operation frequency depends on physical parameters of the transducer, for example the size and geometry of the transducer, in particular, the vibrating element of the transducer. As such, sensor devices that handle multiple operations requiring different operating frequencies may require an array of transducer. The transducer array may include clusters of transducers of different sizes. The transducer array may take up valuable space in the sensor devices and may also compromise the resolution of the sensors.

SUMMARY

According to various non-limiting embodiments, there may be provided a MEMS device including: a first electrode region; a first piezoelectric layer arranged over the first electrode region; a second electrode region arranged over the first piezoelectric layer; a second piezoelectric layer arranged over the first piezoelectric layer and the second electrode region; a third electrode region arranged over the second piezoelectric layer; a first input port coupled to at least one of the first electrode region and/or the second electrode region for providing a first electrical signal to the first piezoelectric layer to generate a first vibration in the first piezoelectric layer; a second input port coupled to at least one of the second electrode region and/or the third electrode region for providing a second electrical signal to the second piezoelectric layer to generate a second vibration in the second piezoelectric layer; and an output port configured to receive an output signal including a superposition of the first vibration and the second vibration.

According to various non-limiting embodiments, there may be provided a method for fabricating a MEMS device, the method including: arranging a first piezoelectric layer over a first electrode region; arranging a second electrode region over the first piezoelectric layer; arranging a second piezoelectric layer over the first piezoelectric layer and the second electrode region; arranging a third electrode region over the second piezoelectric layer; coupling a first input port to at least one of the first electrode region and/or the second electrode region for providing a first electrical signal to the first piezoelectric layer to generate a first vibration in the first piezoelectric layer; coupling a second input port to at least one of the second electrode region and/or the third electrode region for providing a second electrical signal to the second piezoelectric layer to generate a second vibration in the second piezoelectric layer; and providing an output port configured to receive an output signal including a superposition of the first vibration and the second vibration.

According to various non-limiting embodiments, there may be provided a method for generating a plurality of frequencies where the method includes providing a MEMS device including: providing a first electrical signal to the first piezoelectric layer to generate a first vibration in the first piezoelectric layer through a first input port coupled to at least one of the first electrode region and/or the second electrode region; providing a second electrical signal to the second piezoelectric layer to generate a second vibration in the second piezoelectric layer, through a second input port coupled to at least one of the second electrode region and/or the third electrode region; and receiving an output signal including a superposition of the first vibration and the second vibration, using an output port. The MEMS device may have or include, but is not limited to, a first electrode region; a first piezoelectric layer arranged over the first electrode region; a second electrode region arranged over the first piezoelectric layer; a second piezoelectric layer arranged over the first piezoelectric layer and the second electrode region; and a third electrode region arranged over the second piezoelectric layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 21 illustrates a flow diagram of a method for generating a plurality of frequencies according to various non-limiting embodiments.

DESCRIPTION

Figure 1:
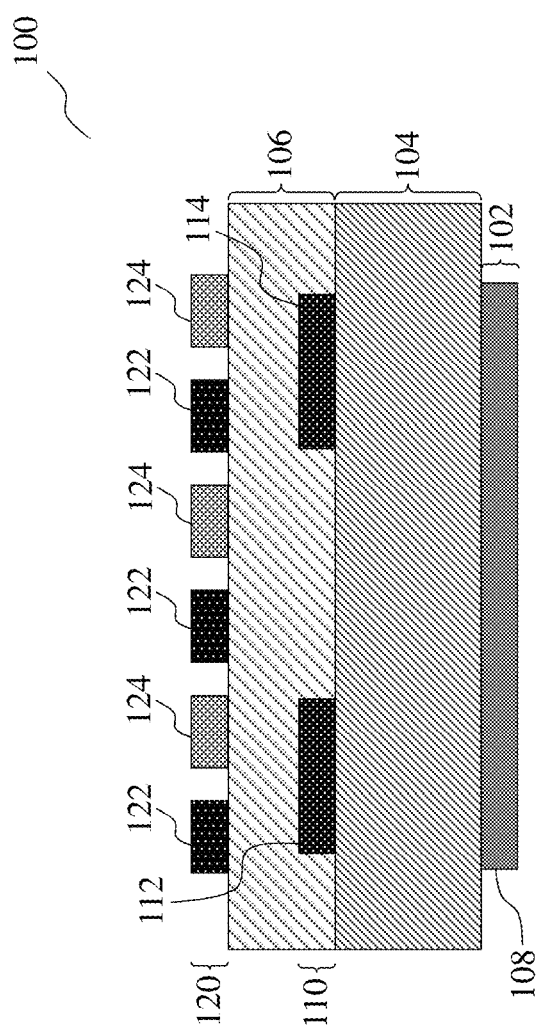
FIG. 1 illustrates a simplified cross-sectional view of a MEMS device according to various non-limiting embodiments.

Embodiments described below in context of the devices are analogously valid for the respective methods, and vice versa. Furthermore, it will be understood that the embodiments described below may be combined, for example, as part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

According to various embodiments, a transducer may be provided. The transducer may be a MEMS device. The transducer may be capable of generating acoustic signals of various frequencies. The transducer may receive multiple electrical input signals through multiple ports, each electrical input signal having a different frequency. The transducer may include a plurality of piezoelectric layers (also referred herein as a piezoelectric stack), each layer receiving an electrical input signal. The piezoelectric layers may also be referred herein as acoustic layers. Each piezoelectric layer may be capable of transducing electrical energy into mechanical energy or sound energy, in other words, transduce an electrical signal into vibrations. The transducer may include a plurality of electrode regions, each electrode region including at least one electrode for coupling the electrical input signal to a piezoelectric layer. Each electrode region may include a plurality of coplanar electrodes, for example, two electrodes, where each electrode in the electrode region is coupled to a different piezoelectric layer. Each electrode region may be stacked over a piezoelectric layer. The transducer may have a layered structure, where the piezoelectric layers and the electrode regions are alternatingly stacked over each other. Each electrical input signal may activate the corresponding respective piezoelectric layer to vibrate, the vibration carrying the frequency of the electrical input signal. The plurality of piezoelectric layers may be stacked, so that each piezoelectric layer may contact or substantially overlap with at least one other piezoelectric layer. The vibrations of the plurality of piezoelectric layers may couple together, through the areas of contact between the different piezoelectric layers. The resultant overall vibration of the piezoelectric stack may include a plurality of frequencies. In other words, through the coupling of the vibrations of the different piezoelectric layers, the transducer may heterodyne the received input signals to generate an output signal that includes a plurality of frequencies. As the plurality of piezoelectric layers and the plurality of electrodes are stacked, the transducer may occupy only the footprint of a prior art single-frequency device.

According to various non-limiting embodiments, a transducer array may be provided. The transducer array may be configured to operate in multiple modes, in other words, in multiple frequencies. The transducer array may include a plurality of transducers, each transducer capable of generating a plurality of frequencies. Each transducer may be identical. The plurality of transducers may be connected to at least one common electrode rail, such that each transducer may receive the same input signals. The transducer array may be used to generate acoustic signals of a plurality of frequencies.

According to various non-limiting embodiments, a method for mixing acoustic signals may be provided. The method may include receiving a plurality of input acoustic signals. Each acoustic signal may have a dominant spectral component. The method may include mixing the plurality of acoustic signals in an acoustic layer of a MEMS device. As a result of the mixing, the acoustic layer may generate an output signal. The spectral components of the output signal may depend on the dominant spectral components of the plurality of input acoustic signals.

According to various non-limiting embodiments, a method to realize a multi-frequency array may be provided. The method may include designing a MEMS transducer with at least three ports. The MEMS transducer may include at least one thin-film acoustic layer and at least two conductive layers. The method may include replicating the design of the MEMS transducer to form a one-dimensional or two-dimensional array of identical MEMS transducers, and then fabricating the array. The method may include assigning two ports as input ports for electrical excitation. The array of MEMS transducers may share the same electrical connections to the input ports. The method may include assigning at least a third port as an output port. The output port may be an electrical port or a mechanical port. The method may further include creating acoustic mixing products by exciting the input ports with RF signals. The method may include picking up acoustic mixing products signal from the port designated as the output port.

According to various non-limiting embodiments, a method for generating a plurality of frequencies may include providing a plurality of transducers. The plurality of transducers may be arranged to form an array. Each transducer may be a MEMS device, for example a piezoelectric micromachined ultrasonic transducer. The method may include creating a first electrical connection to at least one of a plurality of input ports of all the transducers in the array. The method may further include creating at least a second electrical connection to at least another input port of all the transducers in the array. The method may further include creating at least a third electrical connection to the at least one output port of all the transducers in the array. The method may also include connecting a first radio frequency (RF) signal source to the first electrical connection, and connecting a second RF signal source to the second electrical connection. Each of the RF signal source may be configured to provide or generate a respective RF signal. Each of the RF signals may be an electrical signal, for example, in the form of an alternating current. The method may include activating the first RF signal source to excite at least one resonance mode of all the transducers in the array, and activating the second RF signal source to excite at least one resonance mode of all the transducers in the array. The first RF signal source may excite the transducers to move, or vibrate, according to frequency $f_1$ in a non-limiting embodiment. The second RF signal source may excite the transducers to move, or vibrate, according to frequency $f_2$ in a non-limiting embodiment. Each transducer of the array may independently mix the RF signals from the first RF signal source and the second RF signal source. As a result, multiple resonant modes may be promoted in each transducer. The multiple resonant modes may have different frequencies.

FIG. 1 illustrates a simplified cross-sectional view of a MEMS device 100 according to various non-limiting embodiments. The MEMS device 100 may be an acoustic transducer, in other words, a device capable of generating acoustic waves. The acoustic waves may be at least substantially in the ultrasonic range, for example, above 20 kHz, for example from 100 kHz to 10 GHz in a non-limiting embodiment, alternatively from 10 MHz to 1 GHz. The MEMS device 100 may be a stacked thin-film device. In other words, the MEMS device 100 may include a plurality of thin films that are stacked together. The thin films may include a first electrode region 102, a first piezoelectric layer 104, a second electrode region 110, a second piezoelectric layer 106, and a third electrode region 120. Each of the first electrode region 102, the second electrode region 110 and the third electrode region 120 may be formed from a respective layer of conductive material, for example at least one of molybdenum (Mo), tungsten (W), aluminum (Al), platinum (Pt), other suitable metals, or combinations thereof. Each of the first piezoelectric layer 104 and the second piezoelectric layer 106 may include or may be formed from at least one of aluminum nitride (AlN), scandium-doped AlN (ScAlN), lithium niobate (LiNbO$_3$), lithium tantalate (LiTa$_2$O$_3$), zinc oxide (ZnO), lead zirconate titanate (PZT), polyvinylidene fluoride (PVDF), any other thin-film piezoelectric material, or combinations thereof. The first piezoelectric layer 104 and the second piezoelectric layer 106 may be formed from the same material. The first piezoelectric layer 104 and the second piezoelectric layer 106 may have different thicknesses to cater for different vibration frequencies. The thickness of the first piezoelectric layer 104 or the second piezoelectric layer 106 may range between 200 nm and 2.0 um in a non-limiting example. The MEMS device 100 may further include a first input port, a second input port, and an output port (not illustrated in FIG. 1).

The first piezoelectric layer 104 may be arranged over the first electrode region 102. The first piezoelectric layer 104 may be formed directly on top of the first electrode region 102 in a non-limiting embodiment, for example, by deposition. The first piezoelectric layer 104 may at least substantially overlap with the first electrode region 102 such that a top surface of the first electrode region 102 may be at least substantially in contact with a bottom surface of the first piezoelectric layer 104.

The second electrode region 110 may be arranged over the first piezoelectric layer 104. The second electrode region 110 may be formed directly on top of the first piezoelectric layer 104 in a non-limiting embodiment, for example, by deposition. The second electrode region 110 may at least substantially overlap with the first piezoelectric layer 104 such that a bottom surface of the second electrode region 110 may at least substantially be in contact with a top surface of the first piezoelectric layer 104. The second electrode region 110 may be smaller in surface area as compared to the first piezoelectric layer 104 such that the top surface of the first piezoelectric layer 104 may not be fully in contact with the second electrode region 110.

The second piezoelectric layer 106 may be formed directly on top of the second electrode region 110, for example by deposition. As the top surface of the first piezoelectric layer 104 may not be fully covered by the second electrode region 110, the second piezoelectric layer 106 may also be at least partially formed over the first piezoelectric layer 104. The second piezoelectric layer 106 may come into direct contact with sections of the top surface of the first piezoelectric layer 106 which are not in direct contact with the second electrode region 110. In other words, the second piezoelectric layer 106 may be arranged over the first piezoelectric layer 104 and the second electrode region 110. The first piezoelectric layer 104 may be at least partially adjacent to the second piezoelectric layer 106.

The third electrode region 120 may be arranged over the second piezoelectric layer 106. The third electrode region 120 may be formed directly on top of the second piezoelectric layer 106, for example, by deposition. The second electrode region 110 may be sandwiched between the first piezoelectric layer 104 and the second piezoelectric layer 106. The first piezoelectric layer 104 may be arranged between the first electrode region 102 and the second electrode region 110. The second piezoelectric layer 106 may be arranged between the third electrode region 120 and the second electrode region 110.

Each of the electrode regions 102, 110 and 120 may include one or more electrodes. For example, the first electrode region 102 may be a single electrode 108 in a non-limiting embodiment. For example, the second electrode region 110 may include electrode 112 and electrode 114. For example, the third electrode region 120 may include electrode 122 and electrode 124. Alternatively, the first electrode region 102 may have two or more electrodes and/or the second electrode region and/or the third electrode region may be single electrodes.

Each of the first input port and the second input port may be coupled to, or may include, at least one electrode. The first input port may be configured to provide a first electrical signal to the first piezoelectric layer 104. To this end, the first input port may be coupled to an electrode that is in contact with the first piezoelectric layer 104. Therefore, the first input port may be coupled to at least one of the first electrode region 102 and the second electrode region 110. The first piezoelectric layer 104 may be excited to vibrate in a first vibration mode, upon receiving the first electrical signal. The second input port may be configured to provide a second electrical signal to the second piezoelectric layer 106. To this end, the second input port may be coupled to an electrode that is in contact with the second piezoelectric layer 106. Therefore, the second input port may be coupled to at least one of the second electrode region 110 and the third electrode region 120. The second piezoelectric layer 106 may be excited to vibrate in a second vibration mode, upon receiving the second electrical signal. In other words, each of the first piezoelectric layer 104 and the second piezoelectric layer 106 may receive an electrical signal through at least a pair of electrodes, which may include electrodes from different electrode regions, or may include electrodes formed within the same electrode region. For example, an electrode 108 from the first electrode region 102 and an electrode 112 or 114 from the second electrode region 110 may connect the first piezoelectric layer 104 to the first electrical signal. For example, electrodes 122, 124 from the third electrode region 120 may connect the second piezoelectric layer 106 to the second electrical signal. Each of the first electrical signal and the second electrical signal may include an oscillation transmitted in the form of an alternating current. The frequency of the oscillations may be referred herein as the spectral components of the respective electrical signals, or the frequencies in the respective electrical signals. The area of contact between the electrode regions 108, 110, 120 and the piezoelectric layers 104, 106 may be maximized so as to generate stronger perturbations, i.e. vibrations in the piezoelectric layers. The larger the area of overlap between an electrode region and a piezoelectric layer, the stronger the perturbation energy excited in the piezoelectric layer.

When the first piezoelectric layer 104 and the second piezoelectric layer 106 simultaneously vibrate, the vibrations in these two layers may be superpositioned to form an output signal. The area of contact between the first piezoelectric layer 104 and the second piezoelectric layer 106 may be maximized, so as to improve the coupling of the vibrations. The larger the area of overlap between the piezoelectric layers, the stronger the coupling of the vibrations. The output port may be configured to receive the output signal. The output port may be an electrical port, in other words, configured to receive the output signal in the form of an alternating current. Alternatively, the output port may be an acoustic port, in other words, configured to receive the output signal in the form of an acoustic wave.

Figure 2:
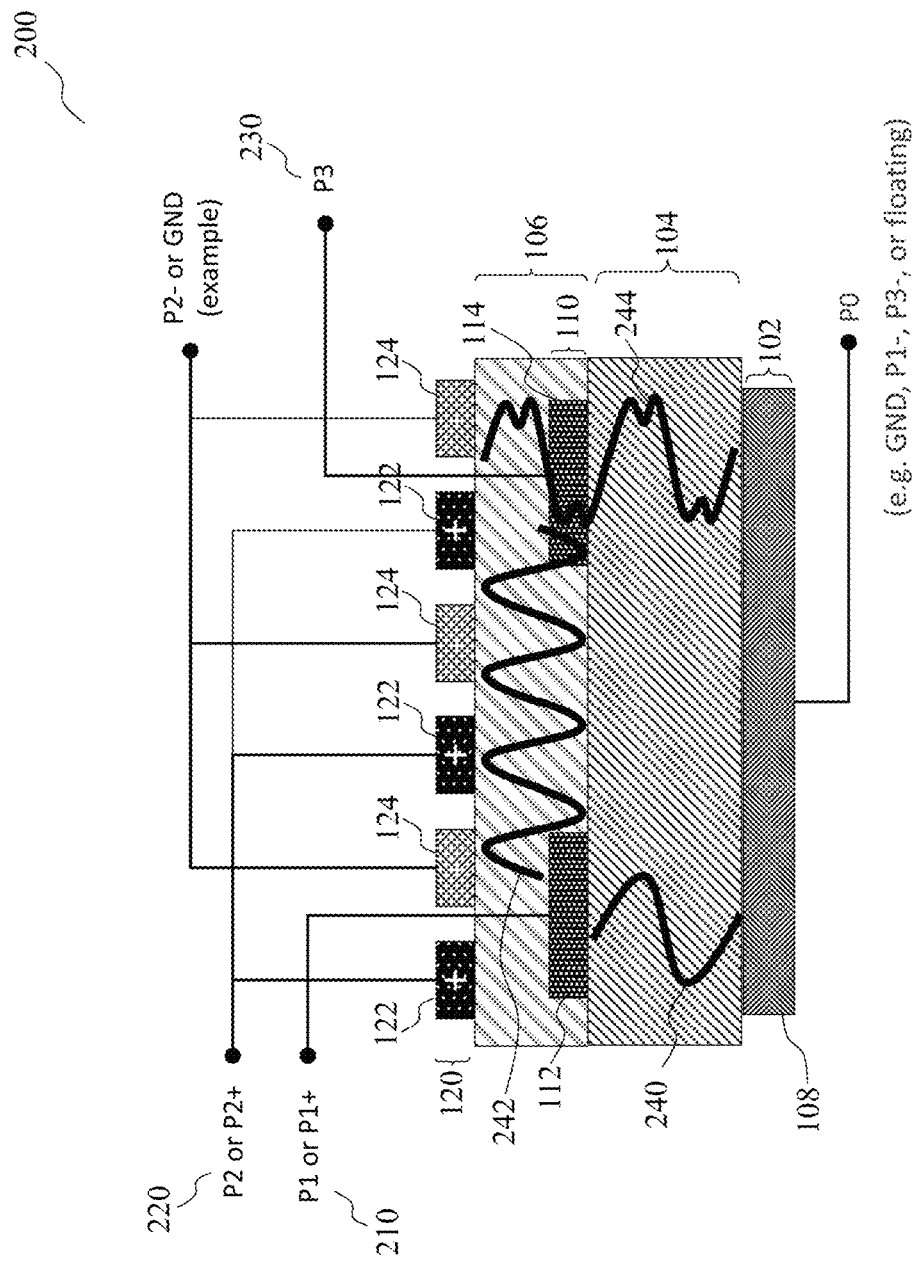
FIG. 2 illustrates a simplified cross-sectional view of a MEMS device in operation, according to various non-limiting embodiments.

FIG. 2 illustrates a simplified cross-sectional view of a MEMS device 200 in operation, according to various non-limiting embodiments. Similar to the MEMS device 100, the MEMS device 200 may also include a first electrode region 102, a first piezoelectric layer 104, a second electrode region 110, a second piezoelectric layer 106, and a third electrode region 120. The MEMS device 200 may also include a first input port 210, a second input port 220, and an output port 230.

The first input port 210 may be connected to the electrode 112 in the second electrode region 110, and to the electrode 108 in the first electrode region 102. The first input port 210 may provide, or inject, a first electrical signal, to the first piezoelectric layer. The electrode 108 in the first electrode region 102 may be connected to a first voltage rail which may supply ground voltage, floating ground, or voltages denoted as P1− or P3−. The electrode 112 may be connected to a second voltage rail which may supply a voltage denoted as P1 or a voltage denoted as P1+. The first electrical signal may be an AC voltage having a difference of the voltages at the first voltage rail and the second voltage rail. The first electrical signal may excite the first piezoelectric layer 104 to vibrate in a first vibration mode 240.

The second input port 220 may be connected to the electrode 122 and to the electrode 124, both in the third electrode region 120. The second input port 220 may provide, or inject, a second electrical signal, to the second piezoelectric layer. The electrode 122 may be connected to a third voltage rail. The third voltage rail may supply a voltage denoted as P2 or a voltage denoted as P2+. The electrode 124 may be connected to a fourth voltage rail. The fourth voltage rail may supply a voltage denoted as P2− or ground or floating ground. The second electrical signal may be an AC voltage having a difference of the voltages at the third voltage rail and the fourth voltage rail. The second electrical signal may excite the second piezoelectric layer 106 to vibrate in a second vibration mode 242. The second vibration mode may be couplable to the first vibration mode. The coupled vibration may be a vibration in a third vibration mode 244. The second vibration mode may be at least substantially normal or orthogonal to the first vibration mode. For example, the first vibration mode may be a flexural or thickness extensional mode. For example, the second mode may be a transverse or shear extensional mode.

The output port 230 may be coupled to an electrode that is coupled to both the first piezoelectric layer 104 and the second piezoelectric layer 106, for example, the electrode 114. The output port 230 may also be connected to the electrode 108, or to the electrode 124. The output port 230 may receive the coupled vibration in the third vibration mode 244.

Figure 3:
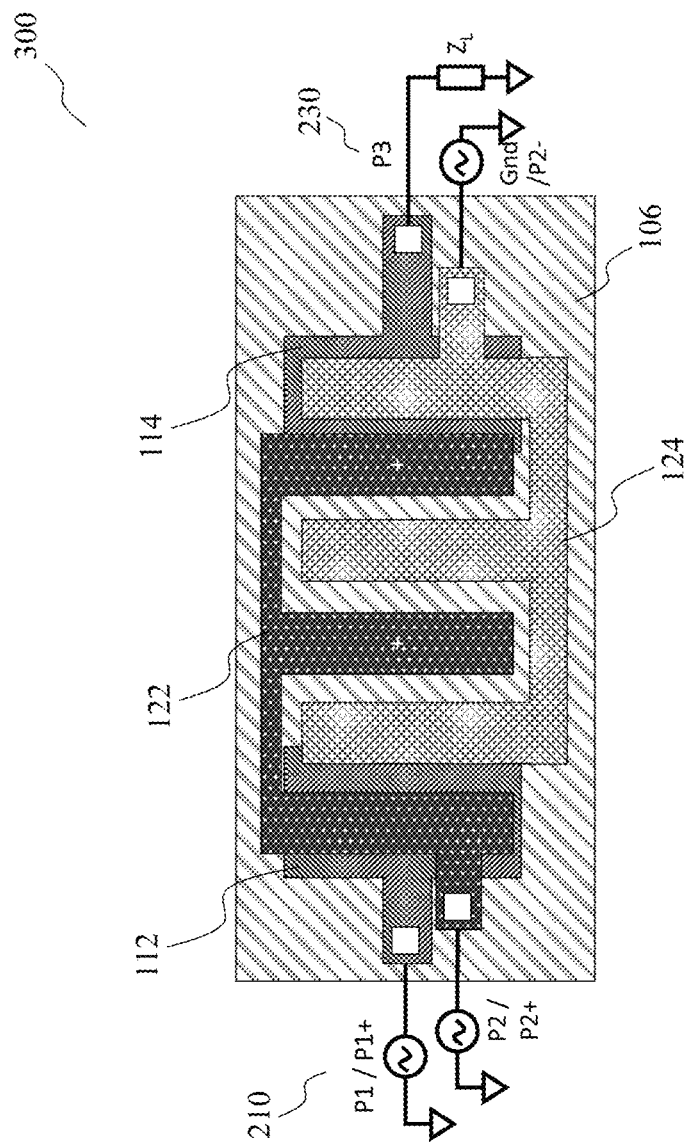
FIG. 3 illustrates a simplified top view of the MEMS device of FIG. 2.

FIG. 3 illustrates a simplified top view 300 of the MEMS device 200. The electrodes 122 and 124 may be interdigitated electrodes patterned out of the third electrode region 120. To generate a plurality of frequencies using the MEMS device 200, a first radiofrequency (RF) signal with frequency $f_1$, i.e. the first input signal, may be applied to the electroded section of the first input port 210 to promote a flexural or thickness extensional (longitudinal) vibration mode in the at least one acoustic layer of the device, for example the first piezoelectric layer 104. A second RF signal with frequency $f_2$, i.e. the second input signal, may be applied to the electroded section of the second input port 220 to promote a transverse or shear-extensional vibration mode in the same acoustic layer (for example: the first piezoelectric layer 104), or another acoustic layer (for example: the second piezoelectric layer 106). The MEMS device 200 may heterodyne the vibrations promoted by the first input port 210 and the vibrations promoted by the second input port 220. The MEMS device 200 may transduce the heterodynized acoustic waves using the electroded section of the output port 230. The resulting heterodynized signal at the output port 230 may feature, at least, spectral components at frequencies $(f_1-f_2)$ and $(f_1+f_2)$ in a non-limiting embodiment. The output port 230 may be an electrical port, electrically terminated with impedance $Z_L$. The impedance of the output port 230 may depend on the thickness of the acoustic layers. The output port 230 may pick up or transduce the heterodynized signal and may couple the heterodynized signal to another electrical circuit, for example a filter.

According to various non-limiting embodiments, the first port may alternatively be coupled to only the first electrode region 102 or to only the second electrode region 110.

According to various non-limiting embodiments, the second port may alternatively be coupled to only the second electrode region 110, or to both the second electrode region 110 as well as to the third electrode region 120.

Figure 4:
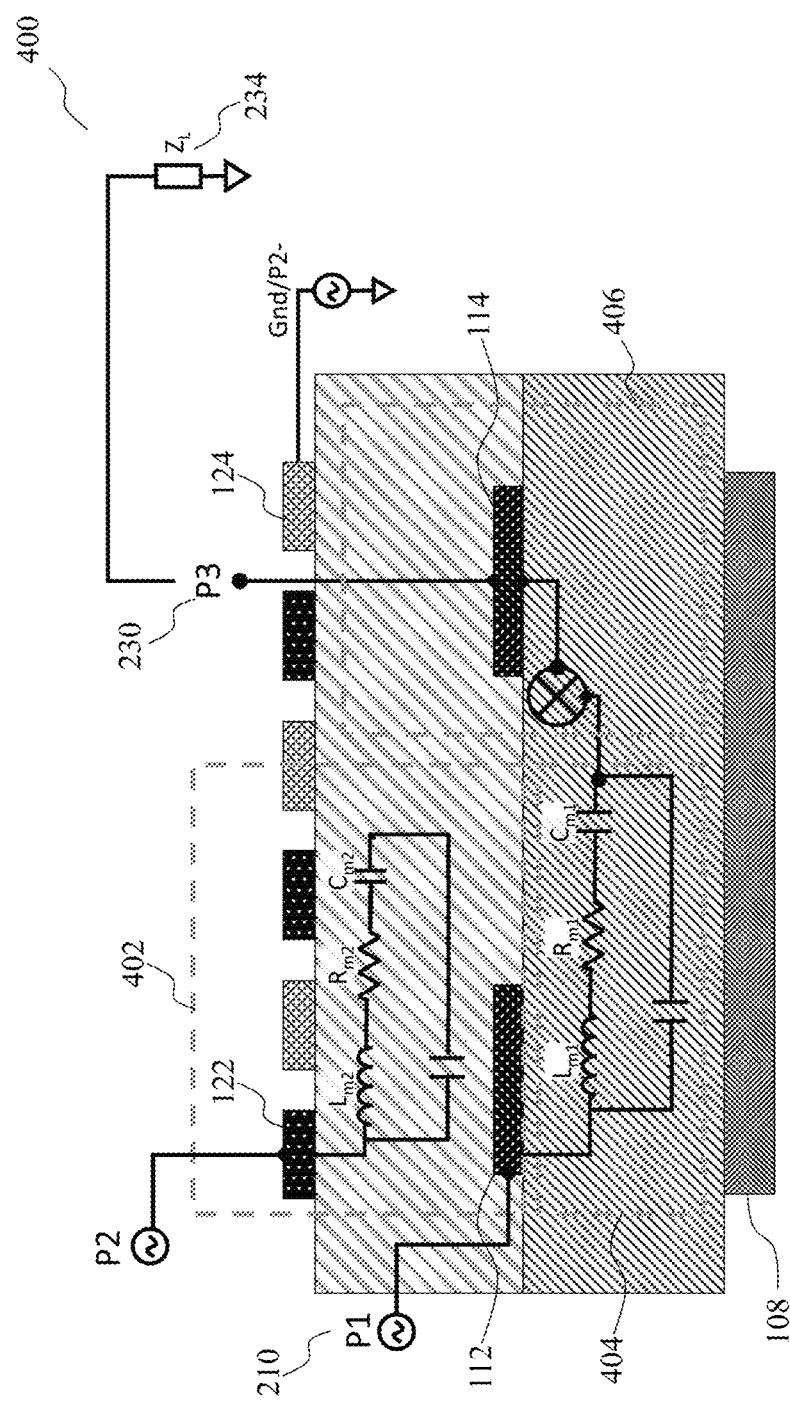
FIG. 4 illustrates a schematic diagram of the MEMS device of FIG. 2.

FIG. 4 illustrates a schematic diagram 400 of the MEMS device 200, the schematic diagram 400 showing an electrical concept diagram overlaid on the cross-sectional view of the MEMS device 200. The MEMS device 200 may conceptually include a first resonator 404, a second resonator 402, and a mixer 406. In a non-limiting embodiment, the first resonator 404 and the second resonator 402, or combinations thereof may be or may include, but are not limited to, a longitudinal resonator, a shear resonator, or combinations thereof. For example, the first resonator 404 may be a longitudinal resonator in a non-limiting embodiment, also referred herein as a thickness extensional resonator. The second resonator 402 may be a shear resonator in a non-limiting embodiment, also referred herein as a lateral resonator. The mixer 406 may mix or heterodyne the resonances in the first resonator 404 and the second resonator 402. The mixing or heterodyning of the vibrations in the first resonator 404 and the second resonator 402 may occur at the acoustic layers of the MEMS device 200.

The first resonator 404 may be coupled to the first input port 210. The first resonator 404 may include at least part of the first piezoelectric layer 104. The first resonator 404 may receive an input signal an electrode in the second electrode region 110, such as the electrode 112 in a non-limiting embodiment. The equivalent-circuit parameters of the first resonator 404 which represent the electromechanical behavior of the first resonator 404, may include a motional inductance $L_{m1}$, a resistance $R_{m1}$, and a capacitance $C_{m1}$. The values of the motional inductance $L_{m1}$, the resistance $R_{m1}$, and the capacitance $C_{m1}$ may depend on the material and thickness of the first piezoelectric layer 104.

The second resonator 402 may be coupled to the second input port 220. The second resonator 402 may include at least part of the second piezoelectric layer 106. The second resonator 402 may receive an input signal from the electrode 122 in the third electrode region 120. The equivalent-circuit parameters of the second resonator 402 may include a motional inductance $L_{m2}$, a resistance $R_{m2}$, and a capacitance $C_{m2}$. The values of the inductance $L_{m2}$, the resistance $R_{m2}$, and the capacitance $C_{m2}$ may depend on the material and thickness of the second piezoelectric layer 106. The mixer 406 may be coupled to the output port 230. The mixer 406 may include at least part of the first piezoelectric layer 104 and/or the second piezoelectric layer 106. The mixer 406 may provide an output signal through the electrode 114. The output port 230 may be electrically terminated with an impedance 234, denoted as $Z_L$.

Figure 5:
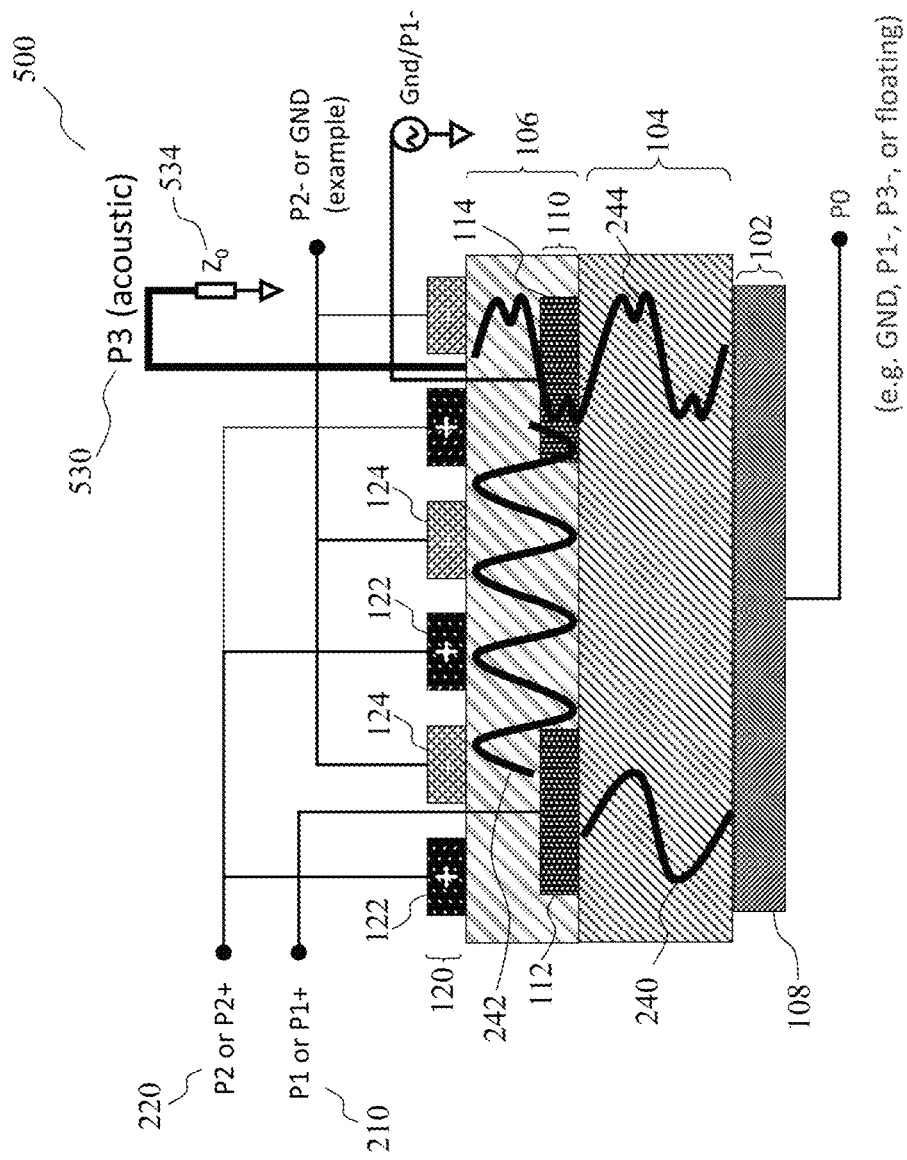
FIG. 5 illustrates a simplified cross-sectional view of a MEMS device according to various non-limiting embodiments.

FIG. 5 illustrates a simplified cross-sectional view of a MEMS device 500 according to various non-limiting embodiments. The MEMS device 500 may include the MEMS device 100. The MEMS device 500 may be similar to the MEMS device 200, in that it also includes the first piezoelectric layer 104, the second piezoelectric layer 106, the first electrode region 102, the second electrode region 110, and the third electrode region 120. The MEMS device 500 may differ from the MEMS device 200, in that the output port 530 is an acoustic port instead of an electrical port. To this end, the output port 530 need not be coupled to an electrode. The output port 530 may couple to the acoustic mixing products, for example, to further couple to subsequent acoustic stages. The output port 530 may be acoustically terminated with impedance 534, denoted as $Z_O$.

Figure 6:
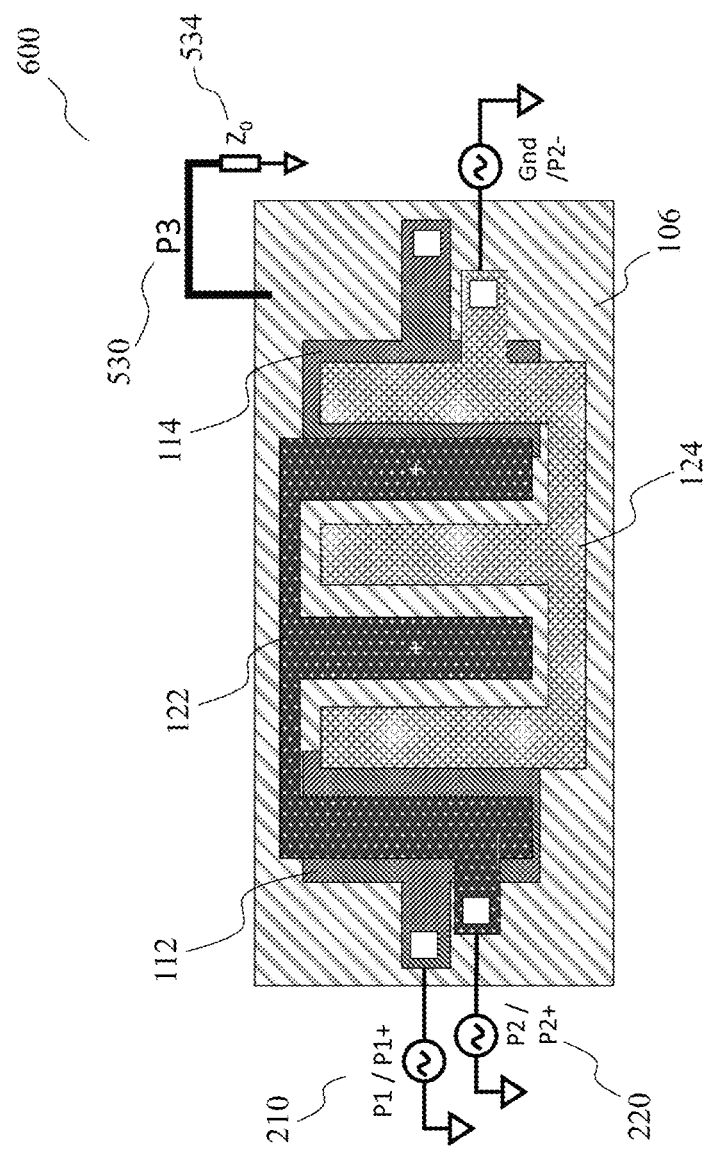
FIG. 6 illustrates a simplified top view of the MEMS device of FIG. 5.

FIG. 6 illustrates a simplified top view 600 of the MEMS device 500.

Figure 7:
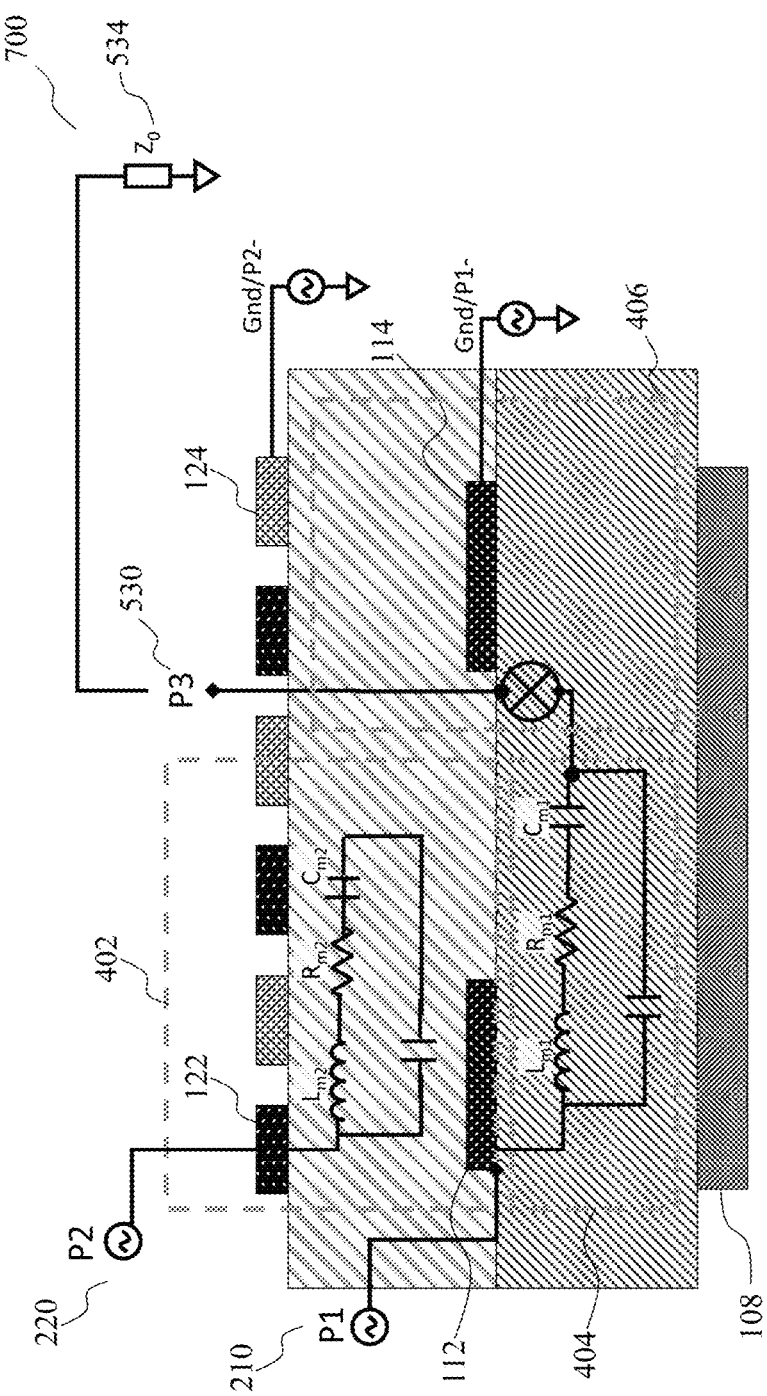
FIG. 7 illustrates a schematic diagram of the MEMS device of FIG. 5.

FIG. 7 illustrates a schematic diagram 700 of the MEMS device 500, the schematic diagram 700 showing an electrical concept diagram overlaid on the cross-sectional view of the MEMS device 500. The schematic diagram 700 may be similar to the schematic diagram 400, except that the mixer 406 may not be coupled to an electrode. The output port 530 may be directly coupled to one of the piezoelectric layers 104 or 106.

FIGS. 8A-8F illustrate simplified cross-sectional views of MEMS devices according to various non-limiting embodiments. The embodiments may include additional features or modifications to the MEMS devices 100, 200, and 500. The additional features or modifications described with respect to any embodiment of FIGS. 8A-8F may be combined with MEMS device 100, 200, 500 or any other embodiment of the MEMS device.

Figure 8A:
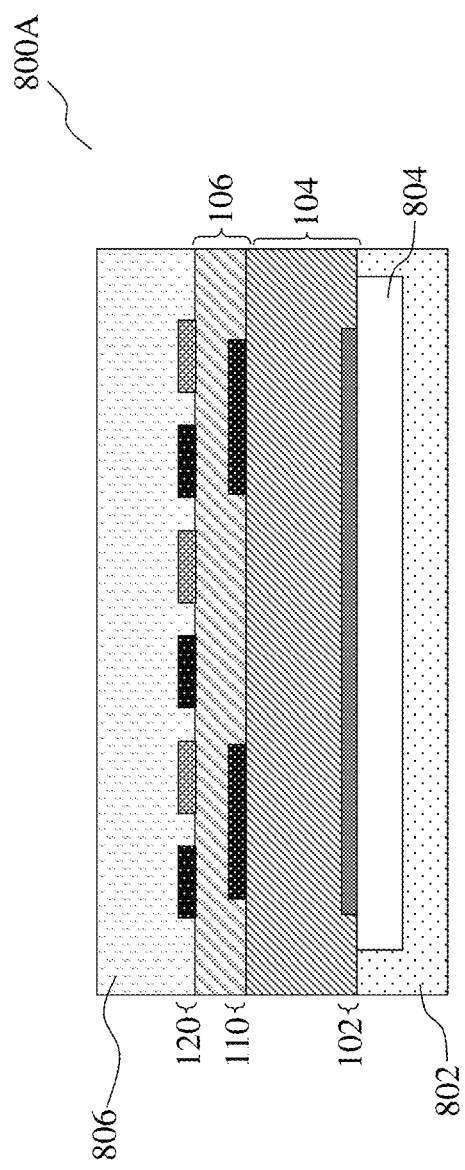
FIGS. 8A-8F illustrate simplified cross-sectional views of MEMS devices according to various non-limiting embodiments.

Referring to FIG. 8A, a MEMS device 800A according to various non-limiting embodiments may include a substrate 802 housing a cavity 804. The substrate 802 may be arranged underneath the first electrode region 102, so that the cavity 804 lies underneath the piezoelectric stack to improve the quality factor (Q factor) of the MEMS device. The MEMS device may further include an elastic layer 806 over the third electrode region 120. The elastic layer 806 may be at least substantially coupled together with the piezoelectric layers such that it moves with the piezoelectric layers as a single member. The elastic layer 806 may seal the MEMS device. The elastic layer 806 may be any one of SiO2, SiN, AlN, Al2O3, or a combination of these materials. The elastic layer 806 may include a dielectric material, so that the elastic layer 806 does not affect the electrical response of the MEMS device 800A. The elastic layer 806 may serve as a passivation layer. The thickness of the elastic layer 806 may be selected to adjust the device's frequency/stiffness. For example, the thicker the elastic layer 806, the stiffer the MEMS device 800A may be. As a result, the operating frequency of the MEMS device 800A may be reduced. The MEMS device 800A may include an acoustic termination impedance in the cavity 804, denoted herein as $Z_{air}$; and an acoustic termination impedance at the elastic layer 806, denoted herein as $Z_1$. Actual coupling of impedances may include the respective impedances of the piezoelectric layers—$Z_{piezo1}$, $Z_{piezo2}$ and $Z_1$. The cavity/air interface may be on an opposite side of the elastic layer 806.

Figure 8B:
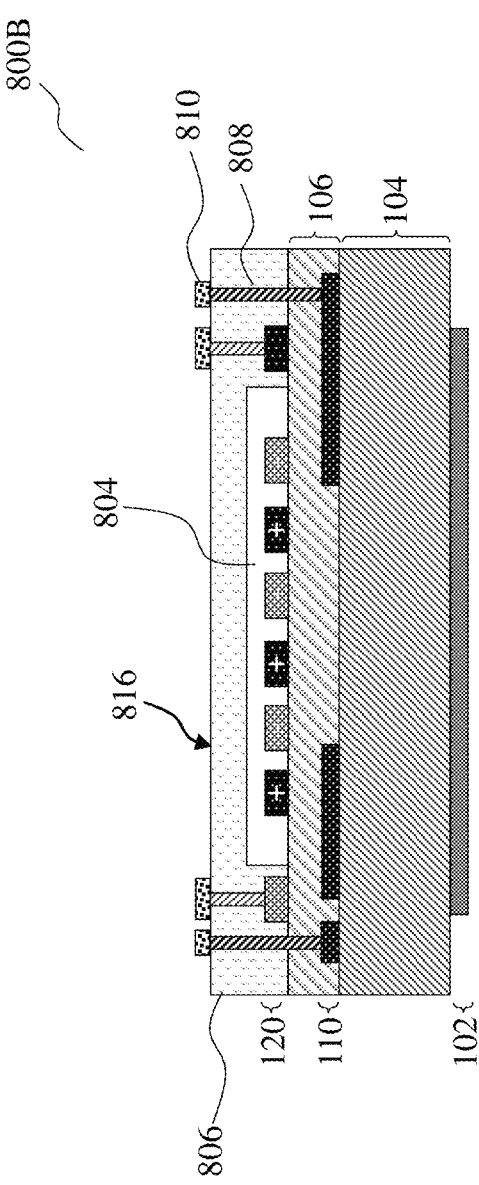

Referring to FIG. 8B, a MEMS device 800B according to various non-limiting embodiments may include a dielectric layer 806 housing a cavity 804 therein. The dielectric layer 806 may be arranged over the third electrode region 120, and its cavity 804 may house electrodes within the third electrode region 120. The dielectric layer 806 may be in direct contact with the second piezoelectric layer 106. The dielectric layer 806 may improve the Q factor of the MEMS device 800B. The MEMS device 800B may further include conductive pillars 808 and conductive pads 810. The conductive pillars 808 may extend from an electrode, through at least one of the second piezoelectric layer 106 and the dielectric layer 806, to reach an external surface of the MEMS device 800B. The conductive pads 810 may be arranged on the external surface 816 and may be in direct contact with the conductive pillars 808. Electrical signals may be coupled to the electrodes via the conductive pads 810.

Figure 8C:
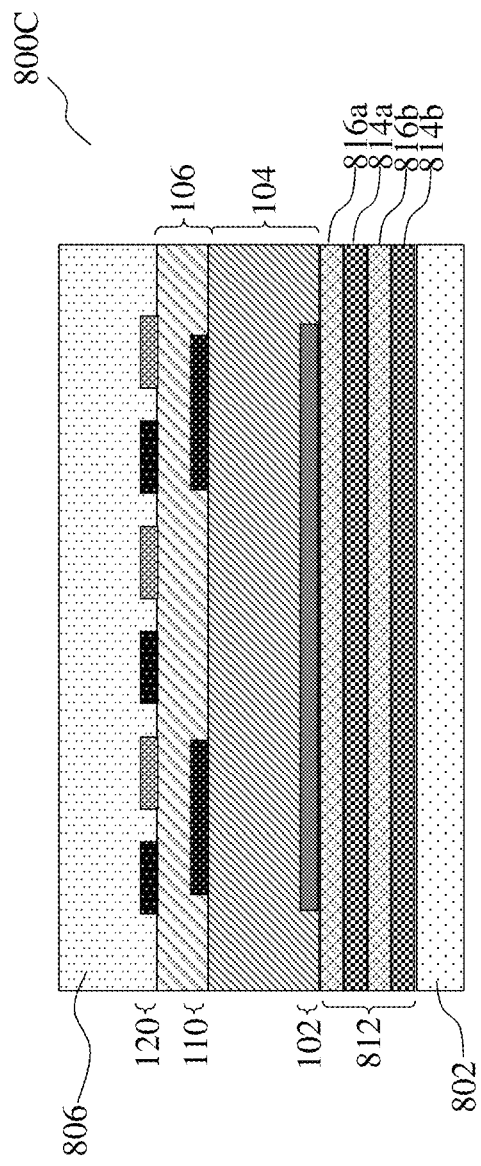

Referring to FIG. 8C, a MEMS device 800C according to various non-limiting embodiments may include a Bragg reflector 812 to improve the Q factor of the MEMS device. The Bragg reflector 812 may include a multilayer stack of films, the films alternating between high-index film and low-index film. For example, the Bragg reflector 812 may include a high-index film 814b and a low-index film 816b arranged over the high-index film 814b. The Bragg reflector 812 may further include another high-index film 814a arranged over the low-index film 816b, and another low-index film 816a arranged over the high-index film 814a. The MEMS device 800C may include a substrate 802 under the Bragg reflector 812.

Figure 8D:
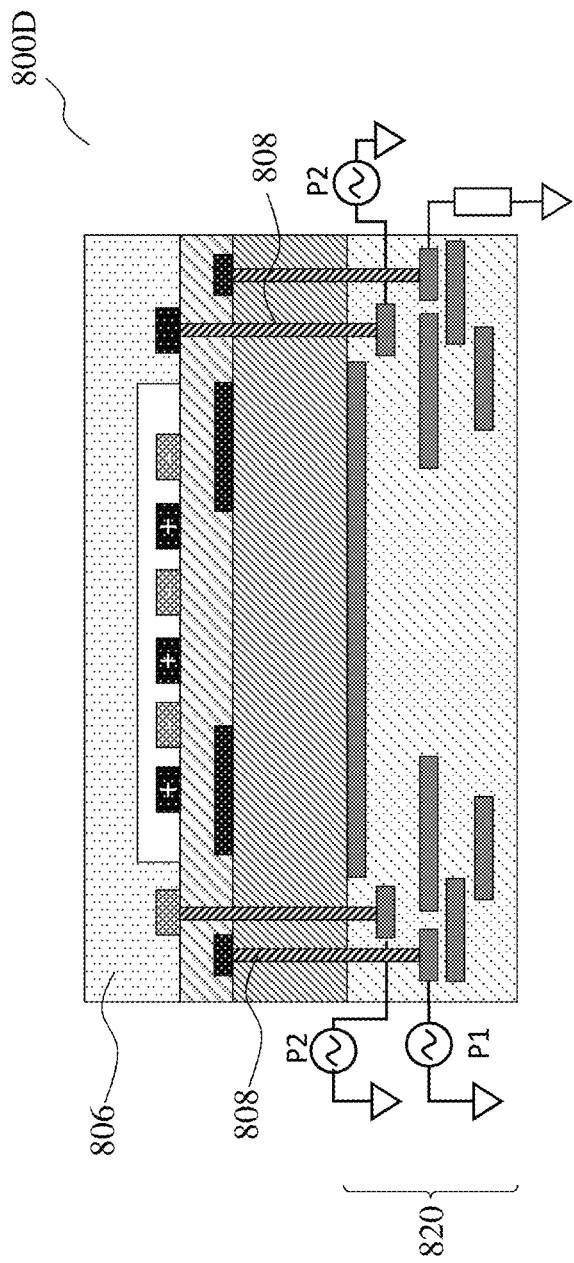

Referring to FIG. 8D, a MEMS device 800D according to various non-limiting embodiments may be monolithically fabricated on an integrated circuit (IC) wafer 820. In other words, the piezoelectric layers may be connected to the IC using the same substrate. The electrodes in the MEMS device 800D may be connected to the IC wafer through conductive pillars. IC wafer 820 may include Back end of line (BEOL) interconnects. The IC wafer 820 may be a CMOS wafer in a non-limiting embodiment.

Figure 8E:
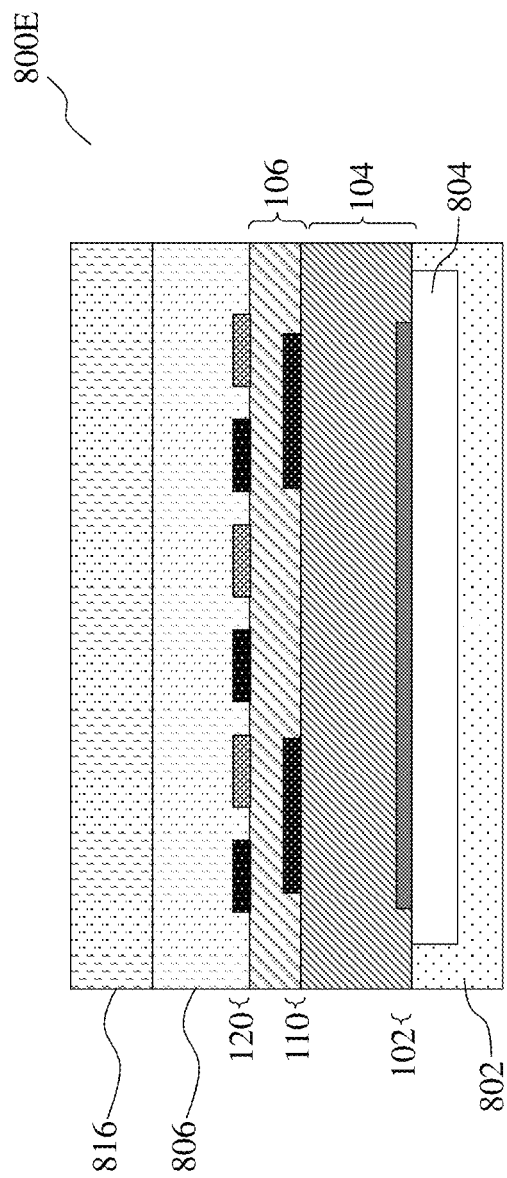

Referring to FIG. 8E, a MEMS device 800E according to various non-limiting embodiments may include a second elastic layer 816 in addition to the MEMS device 800A. The second elastic layer 816, which may have an impedance Z2, may be arranged over the elastic layer 806. As a result, the acoustic termination impedance at the top of the MEMS device 800F may be Z2, impedance of the second elastic layer 816. The actual coupling of impedances may include Zpiezo1, Zpiezo2, Z1, Z2. The first elastic layer 806 and/or the second elastic layer 816 may include at least one of a dielectric material, a conductive material, or a composite thereof.

Figure 8F:
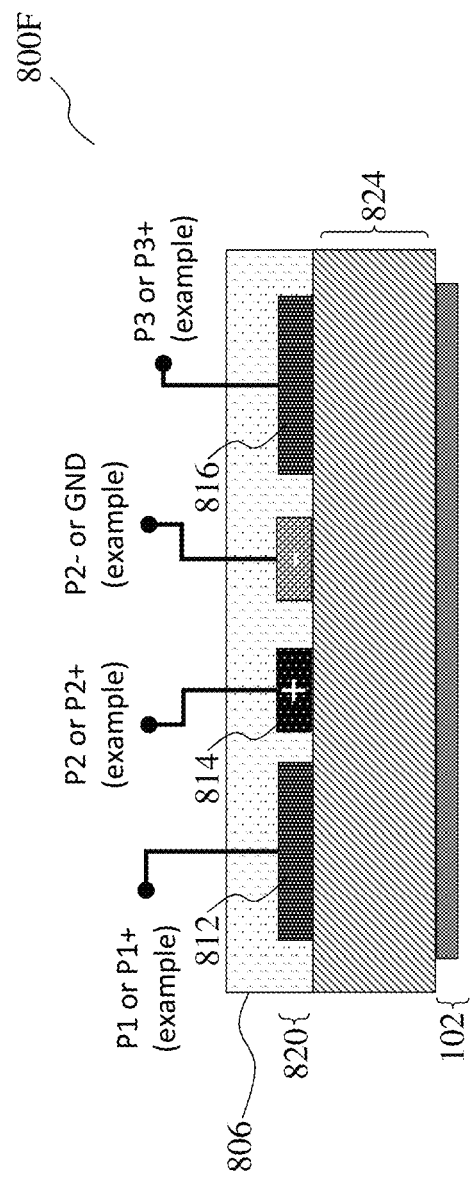

Referring to FIG. 8F, a MEMS device 800F according to various non-limiting embodiments may include only a single piezoelectric layer 824 rather than a plurality of piezoelectric layers. The MEMS device 800F may also include only two electrode regions. For example, the MEMS device 800F may include a first electrode region 102 under a piezoelectric layer 824. The MEMS device 800F may further include a further electrode region 820 over the piezoelectric layer 824. The further electrode region 820 may include at least two electrodes, namely a first electrode 812 coupled to an input port, and a second electrode 814 coupled to another input port. The further electrode region 820 may further include a third electrode 816 coupled to an output port. The first electrode 812, the second electrode 814, and the third electrode 816 may be coplanar. Each of the first electrode 812, the second electrode 814, and the third electrode 816 may directly contact the piezoelectric layer 824.

According to various non-limiting embodiments, the MEMS device 100 may include further piezoelectric layers and further electrode regions. For example, a third piezoelectric layer may be arranged over the third electrode region, and a fourth electrode region may be provided over the third piezoelectric layer.

According to various non-limiting embodiments, the MEMS device 100 may be formed over a substrate, for example a bare silicon wafer. Alternatively, the MEMS device 100 may be formed on an integrated circuit (IC) wafer chip, for example, a CMOS device wafer.

According to various non-limiting embodiments, the MEMS device 100 may further include interconnect vias.

Figure 9A:
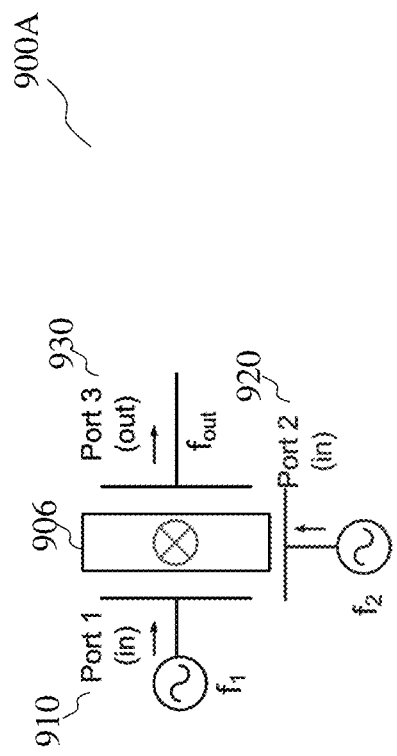
FIG. 9A illustrates a conceptual electrical block diagram of a MEMS device according to various non-limiting embodiments.
Figure 9B:
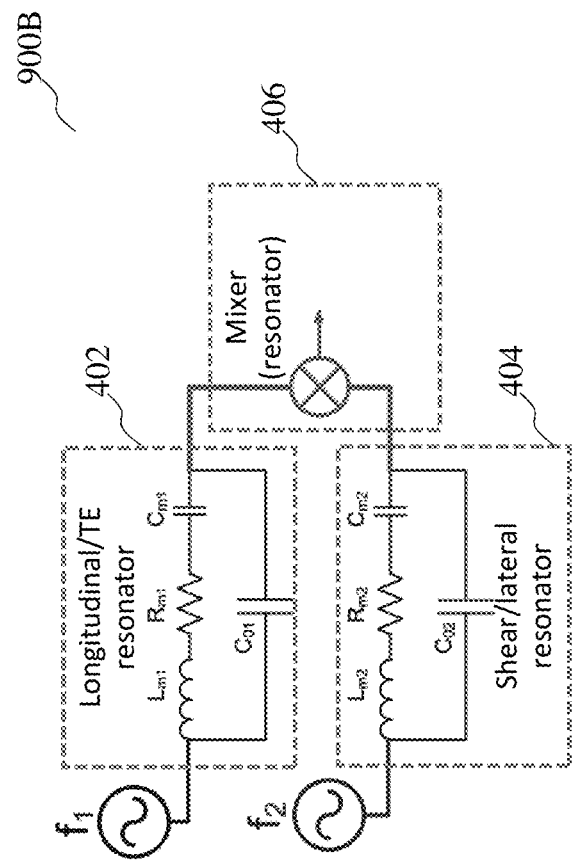
FIG. 9B illustrates a circuit-level model of a MEMS device according to various non-limiting embodiments.

FIG. 9A illustrates a conceptual electrical block diagram 900A of a MEMS device according to various non-limiting embodiments. The conceptual electrical block diagram 900A may be applicable to each of the MEMS device 100, 200, 500 and 800A-800F. The MEMS device may include a first port 910, a second port 920, and a third port 930. The first port 910 and the second port 920 may be input ports. The third port 930 may be an output port. The first port 910 may correspond to the input port 210, and the second port 920 may correspond to the input port 220. Alternatively, the first port 910 may correspond to the input port 220, and the second port 920 may correspond to the input port 210. The third port 930 may correspond to the output port 230 or 530. The first port 910 may inject a first input signal having a frequency $f_1$ to a mixer 906. The second port 920 may inject a second input signal having a frequency $f_2$ to the mixer 906. The mixer 906 may combine the first input signal and the second input signal into a third signal having a frequency $f_{out}$. The frequency $f_{out}$ may be one of $f_1$, $f_2$, $f_1+f_2$ and $f_1-f_2$, multiples thereof or factors thereof FIG. 9B illustrates a circuit-level model 900B of a MEMS device according to various non-limiting embodiments. The conceptual electrical block diagram 900B may be applicable to each of the MEMS device 100, 200, 500 and 800A-800F. The MEMS device may include a first resonator 402, a second resonator 404, and a mixer 406.

In the following, a simulation of a MEMS device according to various non-limiting embodiments will be described. The MEMS device may be simulated and analyzed using an Advanced Design System (ADS) model and finite element.

Figure 10:
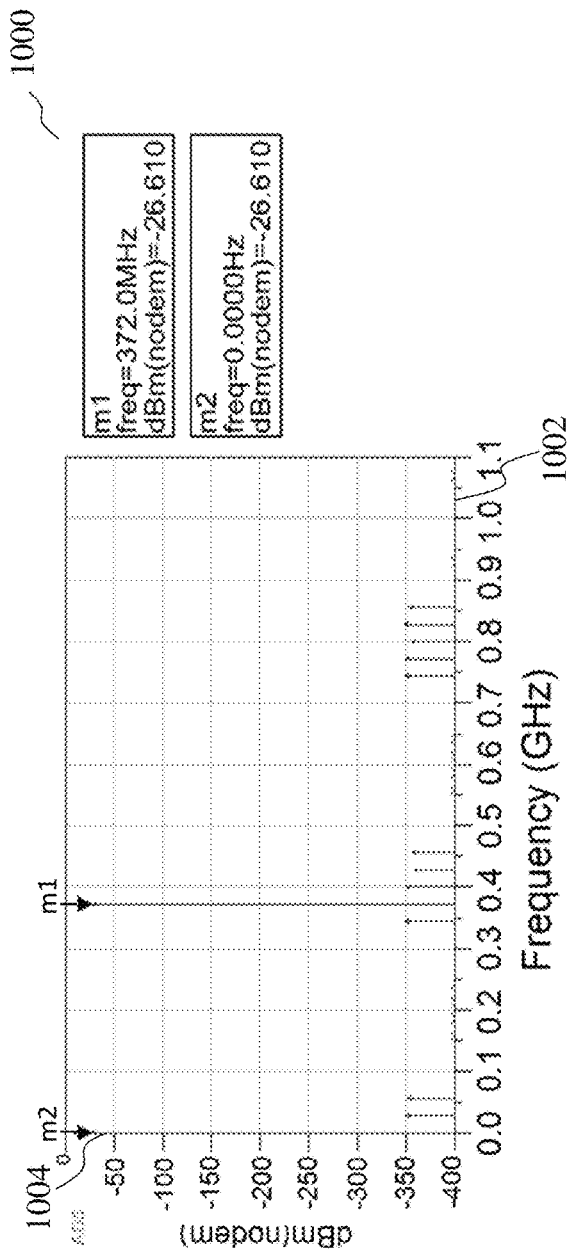
FIGS. 10 and 11 show graphs presenting the simulation results of two different test cases.
Figure 11:
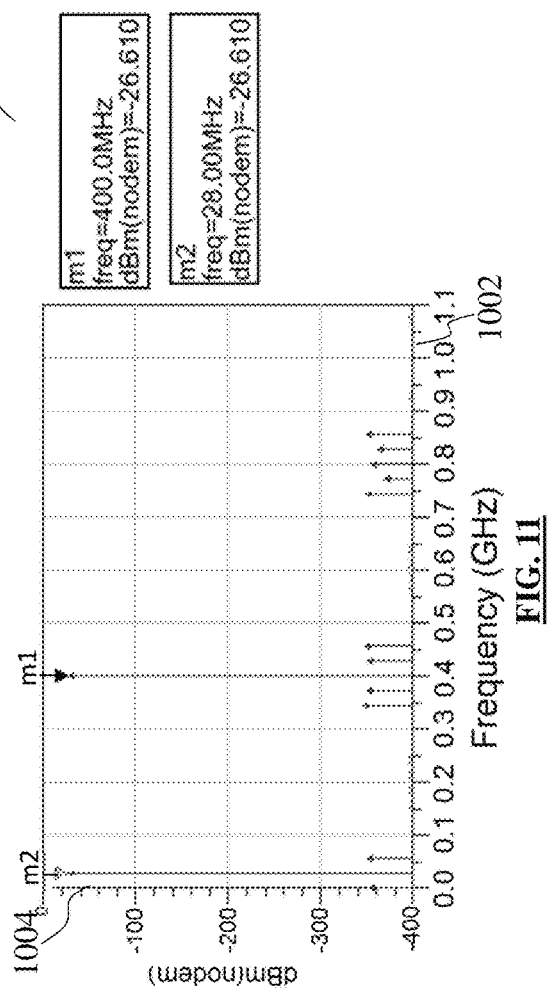

FIGS. 10 and 11 shows graphs presenting the simulation results of two different test cases. The graphs in FIGS. 1 and 11 each include a horizontal axis 1002 indicating frequency in Gigahertz (GHz), and a vertical axis 1004 indicating amplitude in dBm. FIG. 10 shows a graph 1000 of case 1, where two identical frequencies are mixed. In other words, the electrical signals fed to both the first input port and the second input port have the same frequency. In this simulation, both $f_1$ and $f_2$ are set to 186 MHz. The graph 1000 includes two peaks, m1 and m2. The peak m2 corresponds to a frequency of 0 GHz while the peak m1 corresponds to a frequency of $2f_1$.

FIG. 11 shows a graph 1100 of case 2, where two different frequencies are mixed. In other words, the electrical signals fed to both the first input port and the second input port have different frequencies. In this simulation, $f_1$ is set to 214 MHz while $f_2$ is set to 186 MHz. The graph 1100 includes two peaks, m1 and m2. The peak m2 corresponds to a frequency of 28 MHz, i.e. f2−f1 while the peak m1 corresponds to a frequency of 400 MHz, i.e. $f_1+f_2$.

Figure 12:
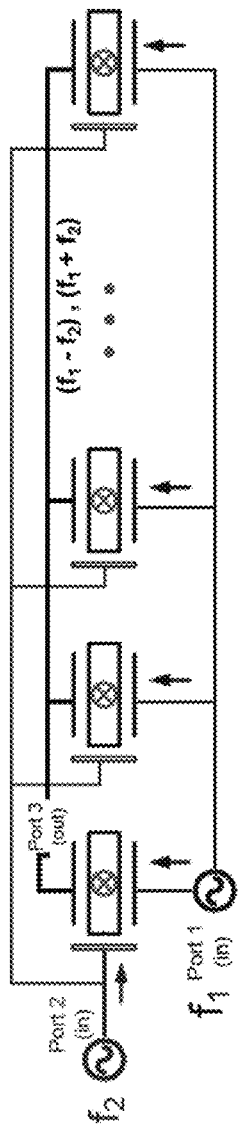
FIG. 12 illustrates an example of a one-dimensional (1D) array including a plurality of MEMS devices according to various non-limiting embodiments.

FIG. 12 illustrates an example of a one-dimensional (1D) array 1200 including a plurality of MEMS devices according to various non-limiting embodiments. The plurality of MEMS devices may be arranged in a single row or column. All of the MEMS device of the 1D array 1200 may be connected to a common first input port 1402, a common second input port 1404, and a common output port 1406. The first input port 1402 may provide an electrical signal having a spectral component f1, to each MEMS device. The second input port 1404 may provide an electrical signal having a spectral component f2, to each MEMS device. Each MEMS device may independently mix the input signals to generate an output signal having spectral components at least substantially equal to at least one of (f1−f2), (f1+f2), multiples thereof or factors thereof. The MEMS device may generate identical output signals, such that the collective output signal may be coupled out of the 1D array 1200 via a single output port 1406.

Figure 13:
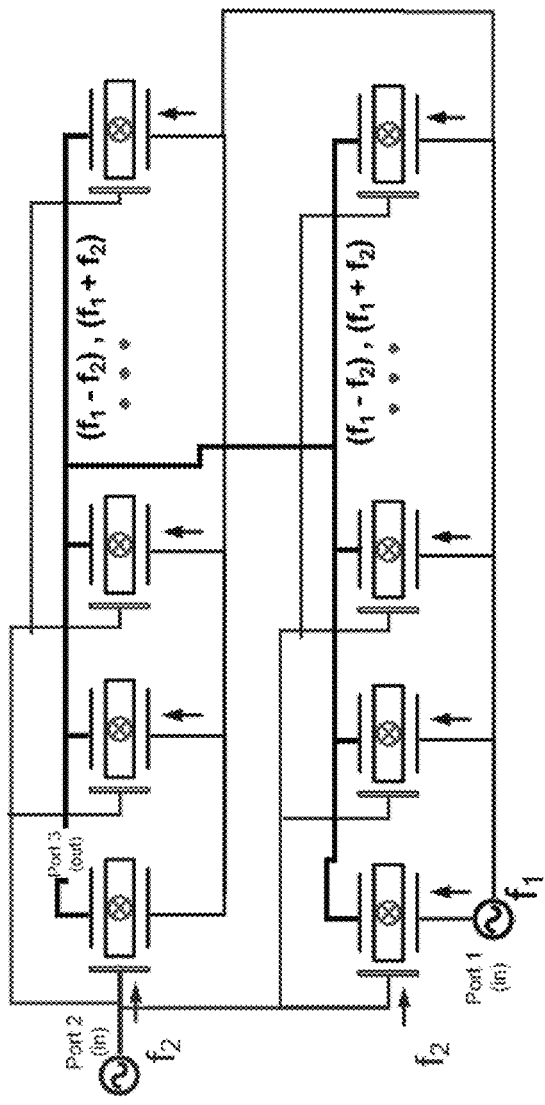
FIG. 13 illustrates an example of a two-dimensional (2D) array including a plurality of MEMS devices according to various non-limiting embodiments.

FIG. 13 illustrates an example of a two-dimensional (2D) array 1300 including a plurality of MEMS devices according to various non-limiting embodiments. Similarly to the 1D array 1200, each MEMS device of the 2D array 1300 may be connected to a common first input port 1402, a common second input port 1404, and a common output port 1406. The MEMS device may generate identical output signals such that the collective output signal may be coupled out of the 1D array 1200 via a single output port 1406.

Figures 14, 15:
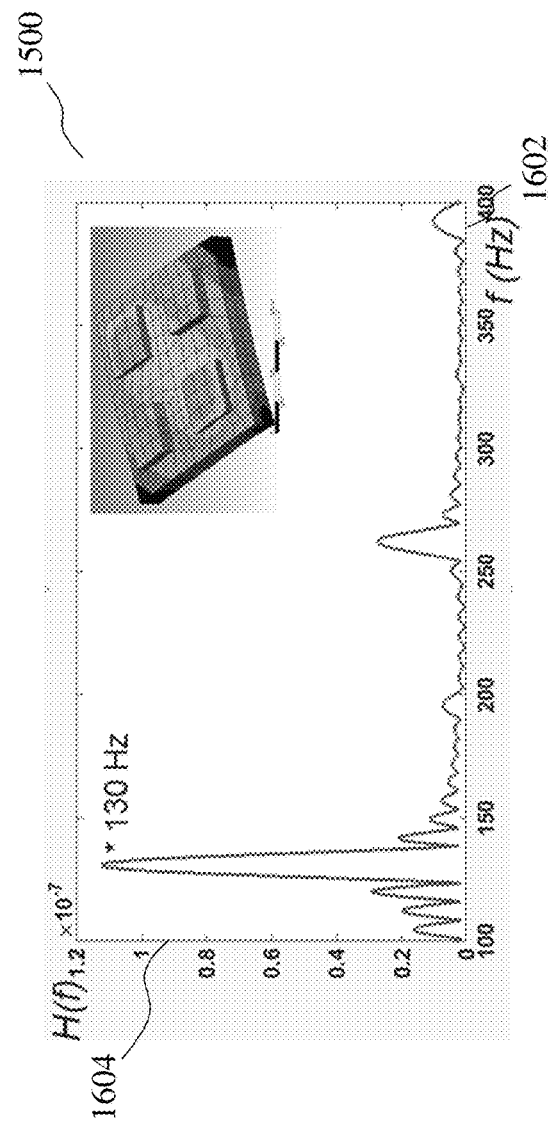
FIG. 14 shows a table illustrating an example of an application of the MEMS device according to various non-limiting embodiments.
FIGS. 15-17 shows finite element modeling results that confirm acoustic mixing in a MEMS device according to the application of FIG. 14.

FIG. 14 shows a table 1400 illustrating an example of an application of a MEMS device according to various non-limiting embodiments. The MEMS device may be used to generate three different frequencies. The MEMS device may receive a first input signal having a frequency f1 of 30.0 MHz and a second input signal having a frequency f2 of 30.2 MHz. The MEMS device may mix the first input signal and the second input signal to generate a first spectral component that corresponds to a difference between f1 and f2, which is 200 kHz. The MEMS device may also generate a second spectral component that corresponds to f1, by receiving only the first input signal. The MEMS device may also generate a third spectral component that corresponds to a sum of f2 and f1, which is 60.2 MHz. The first spectral component of 200 kHz may be suitable for use in gesture recognition applications in a non-limiting embodiment. The second spectral component of 30.0 MHz may be suitable for fingerprint recognition in a non-limiting embodiment. The third spectral component of 60.2 MHz may be suitable for high-end, i.e. high resolution fingerprint resolution in yet another non-limiting embodiment. As such, the same MEMS device may be suitable for use in any one of the abovementioned applications, and may simultaneously serve the three applications.

Figure 16:
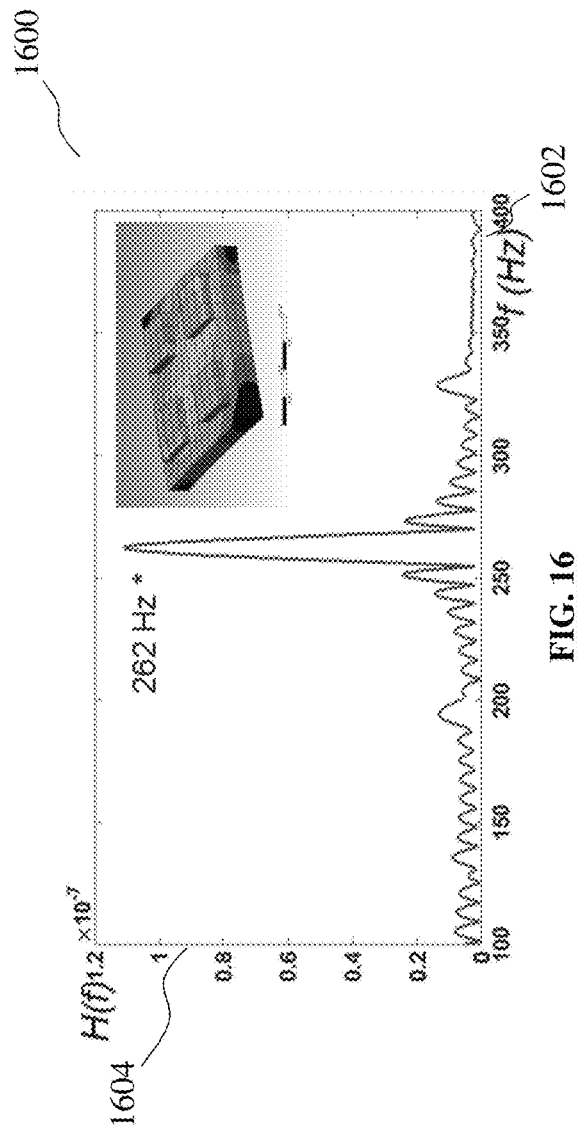
Figure 17:
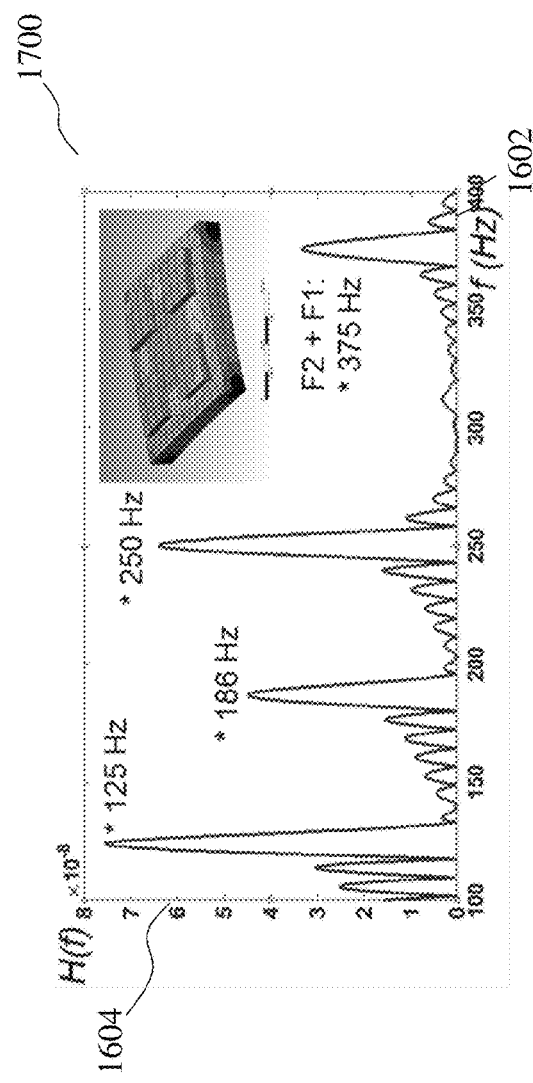

FIGS. 15-17 show finite element modeling results that confirm acoustic mixing in a MEMS device according to the application shown in FIG. 14. Each of FIGS. 15-17 includes a horizontal axis 1602 indicating frequency in hertz (Hz) and a vertical axis 1604 indicating the mechanical amplitude.

FIG. 15 shows a graph 1500 which shows the mechanical response at the first input port where the first input signal has a dominant spectral component 1606 at 130 Hz, denoted as f1.

FIG. 16 shows a graph 1600 which shows the mechanical response at the second input port, where the second input signal has a dominant spectral component 1608 at 262 Hz, denoted as f2.

FIG. 17 shows a graph 1700 which shows the mechanical response at the output port. The output signal combines the spectral components of the first input signal and the second input signal. As a result, the mechanical response at the output port includes spectral components 1610, 1612, 1614 and 1616. The spectral component 1610 corresponds to f1. The spectral component 1612 corresponds to (f1+f2)/2. The spectral component 1614 corresponds to f2. The spectral component 1616 corresponds to f1+f2. Thus, the finite element modeling confirms that acoustic mixing is achieved in the MEMS device.

Figure 18A:
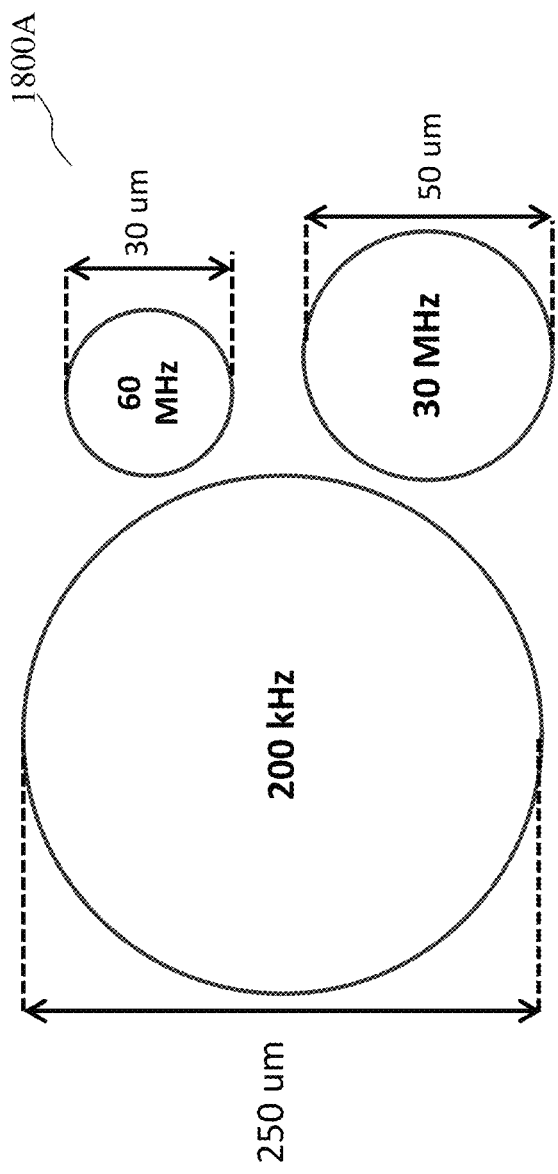
FIGS. 18A-18B illustrates a conceptual comparison between existing multi-frequency transducer array versus a transducer array according to various non-limiting embodiments.
Figure 18B:
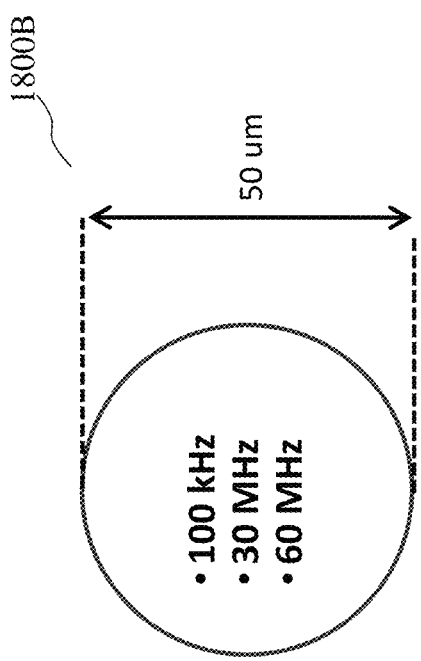

FIGS. 18A-18B illustrates a conceptual comparison between existing multi-frequency transducer array versus a transducer array according to various non-limiting embodiments.

Referring to FIG. 18A, an existing multi-frequency array 1800A may require transducers of different sizes in order to generate different frequencies. For example, to generate an acoustic wave having a frequency of 200 kHz, the transducer size may be 250 um. For example, to generate an acoustic wave having a frequency of 60 MHz, the transducer size may be 30 um. For example, to generate an acoustic wave having a frequency of 30 MHz, the transducer size may be 50 um.

Referring to FIG. 18B, a transducer array 1800B according to various non-limiting embodiments may only require a single transducer of about 50 um in size, to generate three different frequencies of 100 kHz, 30 MHz, 60 MHz. For example, f1=30 MHz, f2=30.1 MHz. f2−f1=100 kHz, f2+f1=60.1 MHz. As such, the transducer array 1800B may use a single device to achieve three different frequencies with a much smaller footprint.

FIGS. 19A-19F illustrates a process flow for manufacturing a MEMS device according to various non-limiting embodiments through a series of simplified cross-sectional views.

Figure 19A:
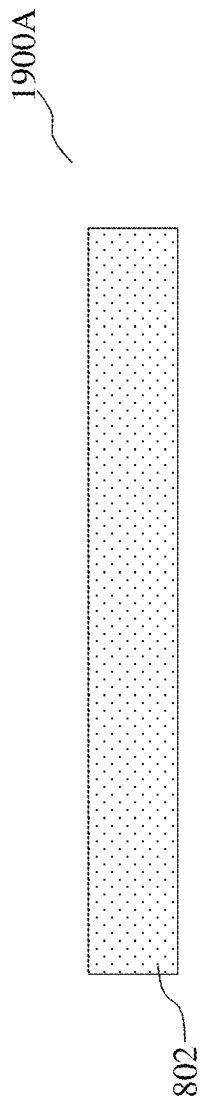
FIGS. 19A-19F illustrates a process flow for manufacturing a MEMS device according to various non-limiting embodiments

FIG. 19A illustrates a process 1900A. The process 1900A may include providing a substrate 802. The substrate 802 may include integrated circuits, for example, the substrate 802 may be a CMOS device wafer. Alternatively, the substrate 802 may exclude integrated circuits, for example, the substrate may be a silicon wafer or glass.

Figure 19B:
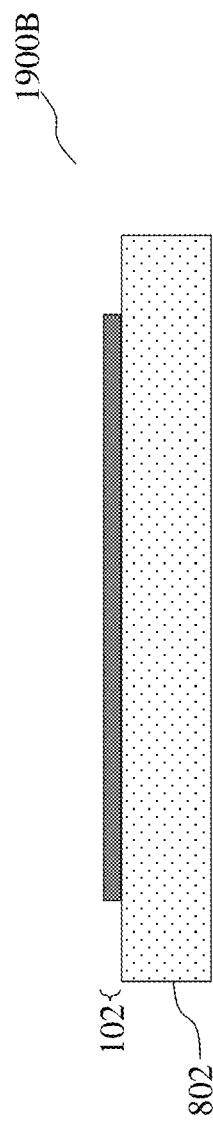

FIG. 19B illustrates a process 1900B. The process 1900B may include forming a first electrode region 102. To form the first electrode region 102, a first metal layer may be deposited on the substrate 802. The first metal layer may be patterned, for example, via etching, to form electrodes. The patterned first metal layer may be the first electrode region 102. The first electrode region 102 may include or may be formed from at least one conductive metal, for example, molybdenum (Mo), tungsten (W), aluminum (Al), platinum (Pt), or combinations thereof.

Figure 19C:
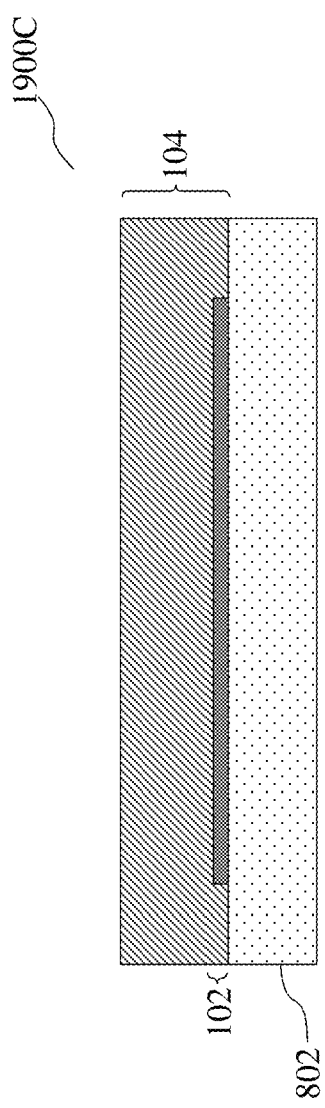

FIG. 19C illustrates a process 1900C in which a first acoustic layer, also referred herein as the first piezoelectric layer 104, is formed. The process 1900C may include depositing a piezoelectric material over the first electrode region 102 and the substrate 802. The first piezoelectric layer 104 may include, or may be formed from, a piezoelectric material, such as anyone of aluminum nitride (AlN), zinc oxide (ZnO), lead zirconate titanate (PZT), polyvinylidene fluoride (PVDF), or combinations thereof.

Figure 19D:
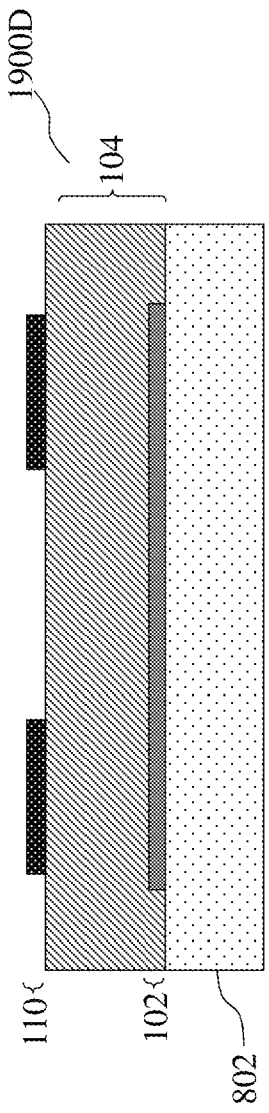

FIG. 19D illustrates a process 1900D in which a second electrode region 110 is formed. A second metal layer may be deposited over the first piezoelectric layer 104. The second metal layer may be patterned to form electrodes. The patterned second metal layer may be the second electrode region 110. The second electrode region 110 may include or may be formed from at least one conductive metal, for example, molybdenum (Mo), tungsten (W), aluminum (Al), platinum (Pt), or combinations thereof.

Figure 19E:
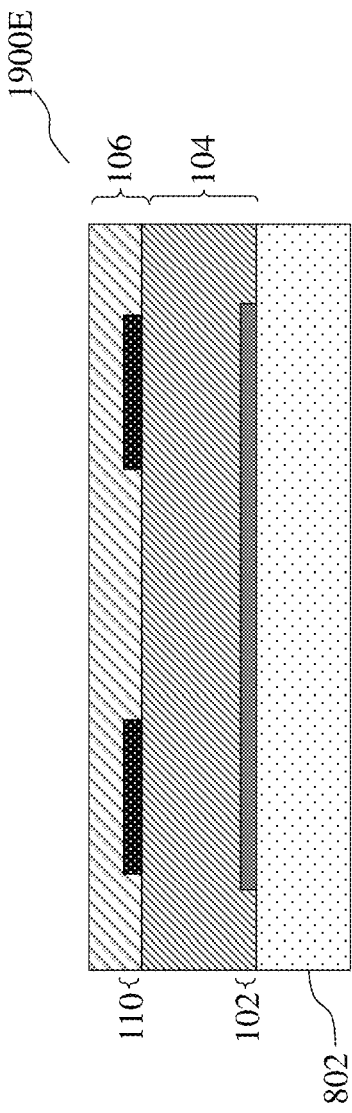

FIG. 19E illustrates a process 1900E in which a second piezoelectric layer 106 is formed. The process 1900E may include depositing a piezoelectric material over the second electrode region 110 and the first piezoelectric layer 104. The piezoelectric material may include, or may be formed from any one of aluminum nitride (AlN), zinc oxide (ZnO), lead zirconate titanate (PZT), polyvinylidene fluoride (PVDF), or combinations thereof. The piezoelectric material may be patterned to form the second piezoelectric layer 106. The second piezoelectric layer 106 may be identical or different in composition, as the first piezoelectric layer 104. The thickness of the second piezoelectric layer 106 may differ from the thickness of the first piezoelectric layer 104.

Figure 19F:
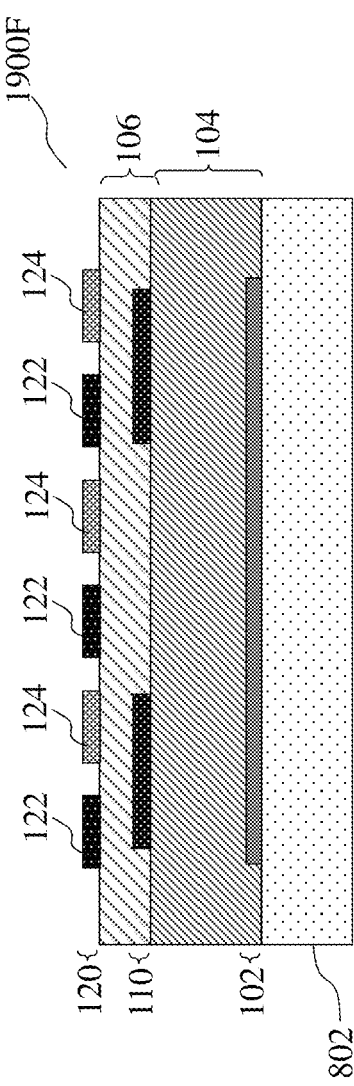

FIG. 19F illustrates a process 1900F in which a third electrode region 120 is formed. A third metal layer may be deposited over the second piezoelectric layer 106. The third metal layer may be patterned to form electrodes. The patterned third metal layer may be the third electrode region 120. The third electrode region 120 may include at least a pair of electrodes. The third electrode region 120 may include or may be formed from at least one conductive metal, for example, molybdenum (Mo), tungsten (W), aluminum (Al), platinum (Pt), or combinations thereof. The resultant device may be a MEMS device according to various non-limiting embodiments, for example, the MEMS device 100, or part of any one of the MEMS device 200, 500 or 800A-800F.

According to various non-limiting embodiments, a MEMS device, for example any one of MEMS device 100, 200, 500 and 800A-800F, may include a first electrode region, a first piezoelectric layer arranged over the first electrode region, a second electrode region arranged over the first piezoelectric layer, a second piezoelectric layer arranged over the first piezoelectric layer and the second electrode region, and a third electrode region arranged over the second piezoelectric layer. The MEMS device may further include a first input port and a second input port. The first input port may be coupled to at least one of the first electrode region and/or the second electrode region, for providing a first electrical signal to the first piezoelectric layer to generate a first vibration in the first piezoelectric layer. The first electrical signal may include a first frequency. The first piezoelectric layer may vibrate according to the first frequency upon receiving the first electrical signal. The second input port may be coupled to at least one of the second electrode region and/or the third electrode region, for providing a second electrical signal to the second piezoelectric layer to generate a second vibration in the second piezoelectric layer. The second electrical signal may include a second frequency. The second piezoelectric layer may vibrate according to the second frequency upon receiving the second electrical signal. The first piezoelectric layer and the second piezoelectric layer may be in direct contact such that the first vibration is couplable to the second vibration. The MEMS device may further include an output port coupled to the second electrode region to receive an output electrical signal. The output signal may include at least one output frequency which may depend on a frequency of the first electrical signal and on a frequency of the second electrical signal.

In other words, a MEMS device according to various non-limiting embodiments may include at least three electrode regions, namely a first electrode region 102, a second electrode region 110 and a third electrode region 120. Each of the at least three electrode regions may include at least one electrode. At least one of the second electrode region 110 and the third electrode region 120 may include at least a pair of interdigitated electrodes. The electrode(s) in at least two of the at least three layers may be at least substantially vertically aligned. The electrode(s) in the second electrode region 110 may be positioned at least substantially over the electrode of the first electrode region 102. The MEMS device may further include at least two acoustic layers, each acoustic layer arranged between two electrode regions. The two acoustic layers may include the first piezoelectric layer 104 and the second piezoelectric layer 106. The first piezoelectric layer 104 and the second piezoelectric layer may have different thicknesses, which may be in a range of 200 nm to 2.0 um. The MEMS device may further include at least three ports. The three ports may include the first input port 210, 910, or 1410, the second input port 220, 920, or 1420 and the output port 230, 530, 930, or 1430. The first input port 210, 910, or 1410 may be configured to provide a first input signal to one acoustic layer. The first input signal may include a first frequency component. The first input port 210, 910, or 1410 may be coupled to the first electrode region 102 and the second electrode region 110 for exciting the first piezoelectric layer 104 to vibrate in a thickness extensional mode. The second input port 220, 920, or 1420 may be coupled to at least a pair of electrodes in the third electrode region 120, for exciting the second piezoelectric layer to vibrate in a shear extensional mode. The second input port 220, 920, or 1420 may be configured to provide a second input signal to the other acoustic layer. The second input signal may include a second frequency component which may be different from the first frequency component. The output port 230, 530, 930, or 1430 may be configured to receive an output signal. The output signal may include frequency components at least substantially equal to the first frequency component and the second frequency component, and frequency components associated with the first frequency component and the second frequency component, such as a difference between the first frequency component and the second frequency component and/or a sum of the first frequency component and the second frequency component. The MEMS device may further include a substrate under the first electrode region 102, for example, a silicon wafer, a silicon-on-insulator wafer, a wafer including an integrated circuit, or a CMOS wafer. The substrate may have a cavity formed therein, so that the piezoelectric layers may flex at least partially into the cavity.

Figure 20:
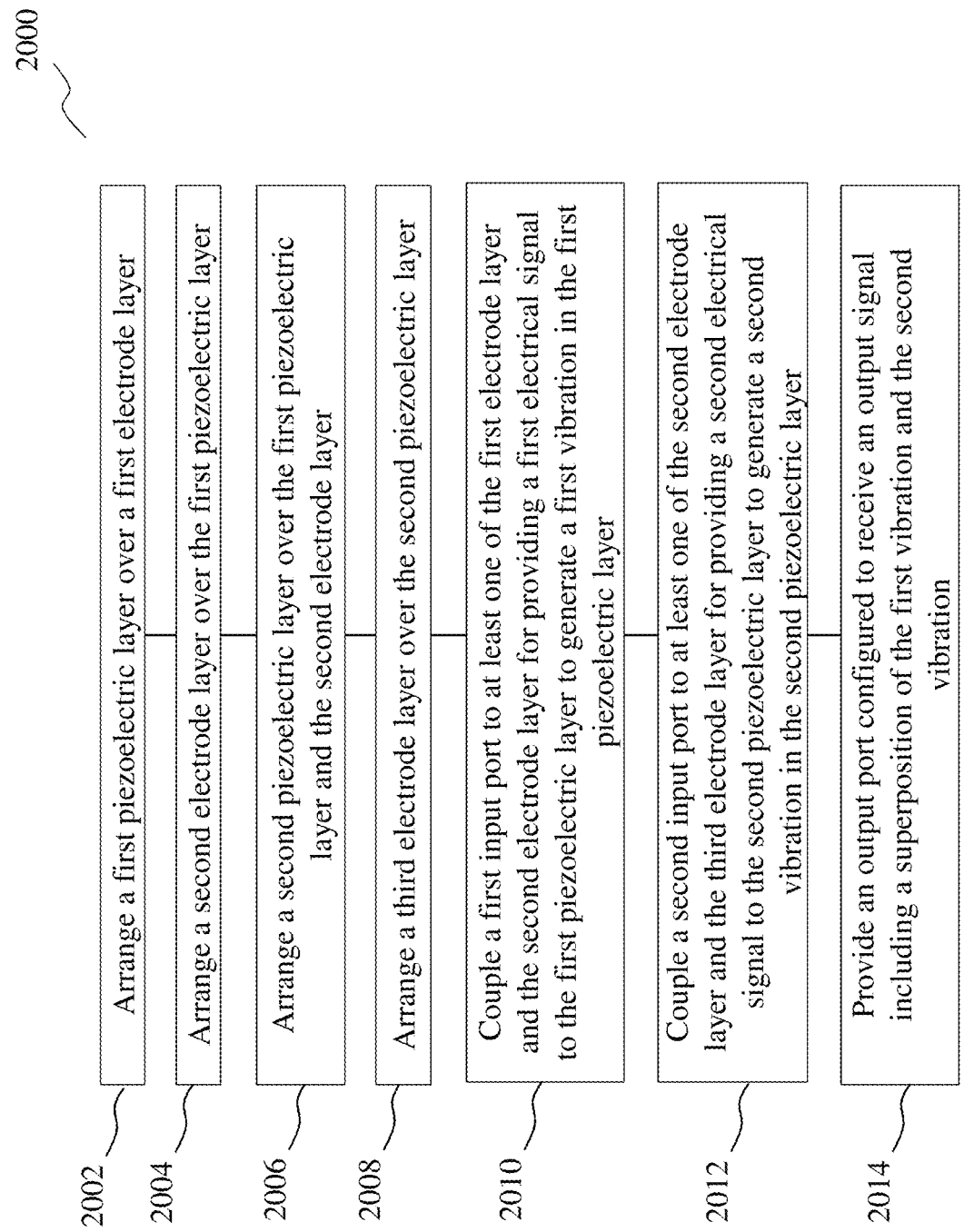
FIG. 20 illustrates a flow diagram of a method for fabricating a MEMS device according to various non-limiting embodiments.

FIG. 20 illustrates a flow diagram 2000 of a method for fabricating a MEMS device according to various non-limiting embodiments. The method may include arranging a first piezoelectric layer over a first electrode region 2002. Element 2002 may include the process 1900C. The method may include arranging a second electrode region over the first piezoelectric layer 2004. Element 2004 may include the process 1900D. The method may include arranging a second piezoelectric layer over the first piezoelectric layer and the second electrode region 2006. Element 2006 may include the process 1900E. The method may include arranging a third electrode region over the second piezoelectric layer 2008. Element 2008 may include the process 1900F. The method may include coupling a first input port to at least one of the first electrode region and the second electrode region for providing a first electrical signal to the piezoelectric layer to generate a first vibration in the first piezoelectric layer 2010. The method may include coupling a second input port to at least one of the second electrode region and the third electrode region for providing a second electrical signal to the second piezoelectric layer to generate a second vibration in the second piezoelectric layer 2012. The method may include providing an output port configured to receive an output signal including a superposition of the first vibration and the second vibration 2014.

FIG. 21 illustrates a flow diagram 2100 of a method for generating a plurality of frequencies according to various non-limiting embodiments. The method may include providing a MEMS device 2012. The MEMS device may be any one of MEMS device 100, 200, 500 and 800A-800F. The method may include providing a first electrical signal to the first piezoelectric layer to generate a first vibration in the first piezoelectric layer, through a first input port coupled to at least one of the first electrode region and the second electrode region 2104. The method may include providing a second electrical signal to the second piezoelectric layer to generate a second vibration in the second piezoelectric layer, through a second input port coupled to at least one of the second electrode region and the third electrode region 2106. The method may include receiving an output signal using an including a superposition of the first vibration and the second vibration, using an output port 2108.

The following examples pertain to further embodiments.

Example 1 is a MEMS device including: a first electrode region; a first piezoelectric layer arranged over the first electrode region; a second electrode region arranged over the first piezoelectric layer; a second piezoelectric layer arranged over the first piezoelectric layer and the second electrode region; a third electrode region arranged over the second piezoelectric layer; a first input port coupled to at least one of the first electrode region and/or the second electrode region, for providing a first electrical signal to the first piezoelectric layer to generate a first vibration in the first piezoelectric layer; a second input port coupled to at least one of the second electrode region and/or the third electrode region, for providing a second electrical signal to the second piezoelectric layer to generate a second vibration in the second piezoelectric layer; and an output port configured to receive an output signal including a superposition of the first vibration and the second vibration.

In example 2, the subject-matter of example 1 can optionally include that the first electrical signal includes a first frequency, and wherein the second electrical signal includes a second frequency different from the first frequency.

In example 3, the subject-matter of example 2 can optionally include that the output signal includes at least one output frequency, wherein the at least one output frequency depends on the first frequency and on the second frequency.

In example 4, the subject-matter of examples 2 or 3 can optionally include that the first piezoelectric layer is configured to vibrate according to the first frequency upon receiving the first electrical signal, wherein the second piezoelectric layer is configured to vibrate according to the second frequency upon receiving the second electrical signal.

In example 5, the subject-matter of any one of examples 1 to 4 can optionally include that the first piezoelectric layer and the second piezoelectric layer are in direct contact such that the first vibration is couplable to the second vibration.

In example 6, the subject-matter of any one of examples 1 to 5 can optionally include that each of the first electrode region, the second electrode region, and the third electrode region includes at least one electrode.

In example 7, the subject-matter of any one of examples 1 to 6 can optionally include that the at least one electrode in the second electrode region is positioned at least substantially over the at least one electrode of the first electrode region.

In example 8, the subject-matter of any one of examples 1 to 7 can optionally include that a thickness of the first piezoelectric layer is different from a thickness of the second piezoelectric layer.

In example 9, the subject-matter of any one of examples 1 to 8 can optionally include that each of the first piezoelectric layer and the second piezoelectric layer has a thickness of at least substantially from 200 nanometers to 2.0 micrometers.

In example 10, the subject-matter of any one of examples 1 to 9 can optionally include that the output port is an electrical port coupled to the second electrode region, wherein the output signal is an electrical signal.

In example 11, the subject-matter of any one of examples 1 to 9 can optionally include that the output port is an acoustic port, wherein the output signal is an acoustic signal.

In example 12, the subject-matter of any one of examples 1 to 11 can optionally include that the first input port is coupled to the first electrode region and the second electrode region, for exciting the first piezoelectric layer to vibrate in a thickness extensional mode.

In example 13, the subject-matter of any one of examples 1 to 12 can optionally include that the second input port is coupled to at least a pair of electrodes in the third electrode region, for exciting the second piezoelectric layer to vibrate in a shear extensional mode.

In example 14, the subject-matter of any one of examples 1 to 13 can optionally include that one or more of the second electrode region and/or the third electrode region includes at least a pair of interdigitated electrodes.

In example 15, the subject-matter of any one of examples 1 to 14 can optionally include: a substrate under the first electrode region, wherein the substrate includes a cavity formed therein.

Example 16 is method for fabricating a MEMS device, the method including: arranging a first piezoelectric layer over a first electrode region; arranging a second electrode region over the first piezoelectric layer; arranging a second piezoelectric layer over the first piezoelectric layer and the second electrode region; arranging a third electrode region over the second piezoelectric layer; coupling a first input port to at least one of the first electrode region and/or the second electrode region for providing a first electrical signal to the first piezoelectric layer to generate a first vibration in the first piezoelectric layer; and coupling a second input port to at least one of the second electrode region and/or the third electrode region for providing a second electrical signal to the second piezoelectric layer to generate a second vibration in the second piezoelectric layer; and providing an output port configured to receive an output signal including a superposition of the first vibration and the second vibration.

Example 17 is a method for generating a plurality of frequencies, the method including: providing a MEMS device including: a first electrode region; a first piezoelectric layer arranged over the first electrode region; a second electrode region arranged over the first piezoelectric layer; a second piezoelectric layer arranged over the first piezoelectric layer and the second electrode region; and a third electrode region arranged over the second piezoelectric layer; providing a first electrical signal to the first piezoelectric layer to generate a first vibration in the first piezoelectric layer, through a first input port coupled to at least one of the first electrode region and/or the second electrode region; and providing a second electrical signal to the second piezoelectric layer to generate a second vibration in the second piezoelectric layer, through a second input port coupled to at least one of the second electrode region and/or the third electrode region; and receiving an output signal including a superposition of the first vibration and the second vibration, using an output port.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various non-limiting embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A microelectromechanical systems (MEMS) device comprising:
    a first electrode region;
    a first piezoelectric layer arranged over the first electrode region;
    a second electrode region arranged over the first piezoelectric layer;
    a second piezoelectric layer arranged over the first piezoelectric layer and the second electrode region;
    a third electrode region arranged over the second piezoelectric layer;
    a first input port coupled to at least one of the first electrode region and/or the second electrode region, for providing a first electrical signal to the first piezoelectric layer to generate a first vibration in the first piezoelectric layer;
    a second input port coupled to at least one of the second electrode region and/or the third electrode region, for providing a second electrical signal to the second piezoelectric layer to generate a second vibration in the second piezoelectric layer; and
    an output port configured to receive an output signal comprising a superposition of the first vibration and the second vibration.

2. The MEMS device of claim 1, wherein the first electrical signal comprises a first frequency, and wherein the second electrical signal comprises a second frequency different from the first frequency.

3. The MEMS device of claim 2, wherein the output signal comprises at least one output frequency, wherein the at least one output frequency depends on the first frequency and on the second frequency.

4. The MEMS device of claim 2, wherein the first piezoelectric layer is configured to vibrate according to the first frequency upon receiving the first electrical signal, wherein the second piezoelectric layer is configured to vibrate according to the second frequency upon receiving the second electrical signal.

5. The MEMS device of claim 1, wherein the first piezoelectric layer and the second piezoelectric layer are in direct contact such that the first vibration is couplable to the second vibration.

6. The MEMS device of claim 1, wherein each of the first electrode region, the second electrode region, and the third electrode region comprises at least one electrode.

7. The MEMS device of claim 1, wherein the at least one electrode in the second electrode region is positioned at least substantially over the at least one electrode of the first electrode region.

8. The MEMS device of claim 1, wherein a thickness of the first piezoelectric layer is different from a thickness of the second piezoelectric layer.

9. The MEMS device of claim 1, wherein each of the first piezoelectric layer and the second piezoelectric layer has a thickness of at least substantially from 200 nanometers to 2.0 micrometers.

10. The MEMS device of claim 1, wherein the output port is an electrical port coupled to the second electrode region, wherein the output signal is an electrical signal.

11. The MEMS device of claim 1, wherein the output port is an acoustic port, wherein the output signal is an acoustic signal.

12. The MEMS device of claim 1, wherein the first input port is coupled to the first electrode region and the second electrode region, for exciting the first piezoelectric layer to vibrate in a thickness extensional mode.

13. The MEMS device of claim 1, wherein the second input port is coupled to at least a pair of electrodes in the third electrode region, for exciting the second piezoelectric layer to vibrate in a shear extensional mode.

14. The MEMS device of claim 1, wherein one or more of the second electrode region and/or the third electrode region comprises at least a pair of interdigitated electrodes.

15. The MEMS device of claim 1, further comprising:
    a substrate under the first electrode region, wherein the substrate comprises a cavity formed therein.

16. A method for fabricating a MEMS device, the method comprising:

arranging a first piezoelectric layer over a first electrode region;

arranging a second electrode region over the first piezoelectric layer;

arranging a second piezoelectric layer over the first piezoelectric layer and the second electrode region;

arranging a third electrode region over the second piezoelectric layer;

coupling a first input port to at least one of the first electrode region and/or the second electrode region for providing a first electrical signal to the first piezoelectric layer to generate a first vibration in the first piezoelectric layer; and coupling a second input port to at least one of the second electrode region and/or the third electrode region for providing a second electrical signal to the second piezoelectric layer to generate a second vibration in the second piezoelectric layer; and providing an output port configured to receive an output signal comprising a superposition of the first vibration and the second vibration.

17. A method for generating a plurality of frequencies, the method comprising:

providing a MEMS device comprising:

a first electrode region;

a first piezoelectric layer arranged over the first electrode region;

a second electrode region arranged over the first piezoelectric layer;

a second piezoelectric layer arranged over the first piezoelectric layer and the second electrode region; and a third electrode region arranged over the second piezoelectric layer;

providing a first electrical signal to the first piezoelectric layer to generate a first vibration in the first piezoelectric layer, through a first input port coupled to at least one of the first electrode region and/or the second electrode region; and providing a second electrical signal to the second piezoelectric layer to generate a second vibration in the second piezoelectric layer, through a second input port coupled to at least one of the second electrode region and/or the third electrode region; and receiving an output signal comprising a superposition of the first vibration and the second vibration, using an output port.

* * * * *

UNITED STATES PATENT AND TRADEMARK OFFICE
CERTIFICATE OF CORRECTION

PATENT NO. : 11,185,886 B2
APPLICATION NO. : 16/205337
DATED : November 30, 2021
INVENTOR(S) : Humberto Campanella Pineda et al.

It is certified that error appears in the above-identified patent and that said Letters Patent is hereby corrected as shown below:

On the Title Page

Item (73), correct the name of the assignee from "VANGUARD INIERNATIONAL SEMICONDUCTOR SINGAPORE PTE. LTD." to --VANGUARD INTERNATIONAL SEMICONDUCTOR SINGAPORE PTE. LTD.--.

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*